(12) United States Patent
Tanoue et al.

(10) Patent No.: US 12,300,495 B2
(45) Date of Patent: *May 13, 2025

(54) PROCESSING APPARATUS AND PROCESSING METHOD

(71) Applicant: Tokyo Electron Limited, Tokyo (JP)

(72) Inventors: Hayato Tanoue, Kumamoto (JP); Yohei Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 487 days.

This patent is subject to a terminal disclaimer.

(21) Appl. No.: 17/627,706

(22) PCT Filed: Jul. 9, 2020

(86) PCT No.: PCT/JP2020/026891
§ 371 (c)(1),
(2) Date: Jan. 17, 2022

(87) PCT Pub. No.: WO2021/010287
PCT Pub. Date: Jan. 21, 2021

(65) Prior Publication Data
US 2022/0254638 A1    Aug. 11, 2022

(30) Foreign Application Priority Data

Jul. 18, 2019  (JP) .................................. 2019-133070

(51) Int. Cl.
*H01L 21/268* (2006.01)
*B23K 26/53* (2014.01)
*B23K 103/00* (2006.01)

(52) U.S. Cl.
CPC ............ *H01L 21/268* (2013.01); *B23K 26/53* (2015.10); *B23K 2103/56* (2018.08)

(58) Field of Classification Search
CPC .  H01L 21/02; H01L 21/02002; H01L 21/304; H01L 21/268; B23K 26/083;
(Continued)

(56) References Cited

U.S. PATENT DOCUMENTS

2022/0168850 A1* 6/2022 Yamashita ............. B23K 26/55
2022/0181157 A1* 6/2022 Tanoue .................. H01L 21/268
(Continued)

FOREIGN PATENT DOCUMENTS

| JP | 2006108532 A | 4/2006 |
| JP | 2013161820 A | 8/2013 |
| JP | 2016215231 A | 12/2016 |

OTHER PUBLICATIONS

International Search Report of PCT/JP2020/026891 dated Oct. 6, 2020.

*Primary Examiner* — Brook Kebede
(74) *Attorney, Agent, or Firm* — Shih IP Law Group, PLLC.

(57) ABSTRACT

A processing apparatus configured to process a processing target object includes a modifying device configured to radiate laser light to an inside of the processing target object to form multiple modification layers along a plane direction of the processing target object; and a controller configured to control an operation of the modifying device at least. The controller controls the modifying device to form: a peripheral modification layer which serves as a starting point where a peripheral portion of the processing target object as a removing target is detached; a first internal modification layer in a ring shape to be concentric with the peripheral modification layer at a diametrically inner side than the peripheral modification layer; and a second internal modification layer in a spiral shape at a diametrically inner side than the first internal modification layer.

4 Claims, 22 Drawing Sheets

(58) Field of Classification Search
CPC .... B23K 26/18; B23K 26/361; B23K 26/402; B23K 26/53
See application file for complete search history.

(56) References Cited

U.S. PATENT DOCUMENTS

| | | | |
|---|---|---|---|
| 2022/0184733 A1* | 6/2022 | Mori | B23K 26/032 |
| 2022/0250190 A1* | 8/2022 | Tanoue | B23K 26/0853 |
| 2022/0250191 A1* | 8/2022 | Tanoue | B23K 26/53 |
| 2022/0314373 A1* | 10/2022 | Mori | B23K 26/53 |

* cited by examiner

PROCESSING APPARATUS AND PROCESSING METHOD

CROSS-REFERENCE TO RELATED APPLICATIONS

This Application is a U.S. national phase application under 35 U.S.C. § 371 of PCT Application No. PCT/JP2020/026891 filed on Jul. 9, 2020, which claims the benefit of Japanese Patent Application No. 2019-133070 filed on Jul. 18, 2019, the entire disclosures of which are incorporated herein by reference.

TECHNICAL FIELD

The various aspects and embodiments described herein pertain generally to a processing apparatus and a processing method.

BACKGROUND

Patent Document 1 discloses a method in which an internal modification layer is formed in a single crystalline substrate, and the substrate is cut using the internal modification layer as a starting point. According to Patent Document 1, the internal modification layer is formed by changing a single crystalline structure of the substrate into a polycrystalline structure while radiating laser light to an inside of the substrate. In addition, in the internal modification layer, adjacent processing traces are connected.

PRIOR ART DOCUMENT

Patent Document 1: Japanese Patent Laid-open Publication No. H2013-161820

DISCLOSURE OF THE INVENTION

Means for Solving the Problems

In an exemplary embodiment, a processing apparatus configured to process a processing target object includes a modifying device configured to radiate laser light to an inside of the processing target object to form multiple modification layers along a plane direction of the processing target object; and a controller configured to control an operation of the modifying device at least. The controller controls the modifying device to form: a peripheral modification layer which serves as a starting point where a peripheral portion of the processing target object as a removing target is detached; a first internal modification layer in a ring shape to be concentric with the peripheral modification layer at a diametrically inner side than the peripheral modification layer; and a second internal modification layer in a spiral shape at a diametrically inner side than the first internal modification layer.

DETAILED DESCRIPTION

Figure 1:
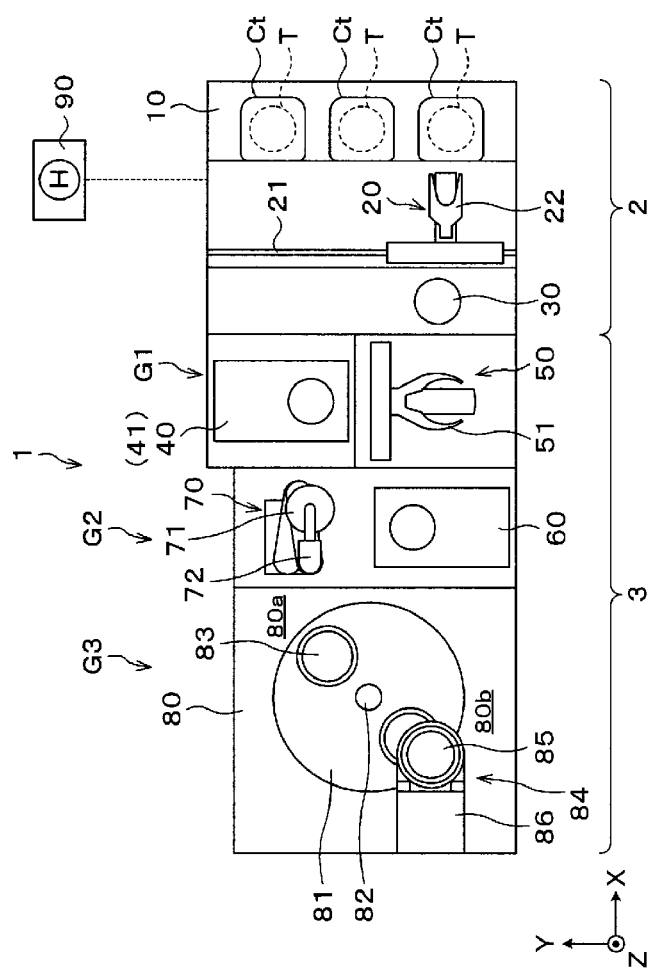
FIG. 1 is a plan view schematically illustrating a configuration example of a wafer processing system.

In a manufacturing process for a semiconductor device, a semiconductor wafer (hereinafter, simply referred to as a wafer) such as a circular substrate having a plurality of devices such as electronic circuits formed on a surface thereof is thinned by radiating laser light to an inside of the wafer to form a modification layer and separating the wafer by using the modification layer as a starting point, as described in Patent Document 1, for example.

For such wafer separation, after the modification layer is formed within the wafer, a tensile force in a detaching direction is applied while holding a front side and a rear side of the wafer. Accordingly, the wafer is separated and thinned using the formed modification layer and cracks propagating from the modification layer as a boundary. In the following description, among separated wafers, the wafer on the front side where the devices are formed will be sometimes referred to as a "first separation wafer," and the wafer on the rear side, as a "second separation wafer".

Further, in the separation of the wafer, an edge trimming processing is performed to suppress a peripheral portion of the wafer from having a sharp pointed shape (a so-called knife edge shape) by the separation. In the edge trimming processing, a modification layer is formed by radiating laser light to an inside of the wafer along a peripheral portion of the wafer as a removing target, and the peripheral portion is detached starting from this modification layer.

However, when performing the separation of the wafer and the removal of the peripheral portion thereof as described above, if the modification layer is formed eccentrically with respect to the wafer, the separation of the wafer and the removal of the peripheral portion thereof may not be performed properly. To be specific, if the modification layer for the detachment is eccentric toward a peripheral side of the wafer, the quality of the removal of the peripheral portion may not be maintained, whereas if the modification layer is eccentric toward a center side of the wafer, the separation may not be performed properly. Patent Document 1 does not mention anything about this eccentricity of the modification layer. Thus, there is a room for improvement.

The present disclosure provides a technique enabling to perform a periphery removing processing and a separation processing for a processing target object appropriately. Hereinafter, a wafer processing system equipped with a processing apparatus according to an exemplary embodiment and a wafer processing method as a processing method will be described with reference to the accompanying drawings. In the present specification and the drawings, parts having substantially the same functions and configurations will be assigned same reference numerals, and redundant description thereof will be omitted.

First, a configuration of the wafer processing system will be discussed. FIG. 1 is a plan view schematically illustrating a configuration of a wafer processing system 1.

Figure 2:
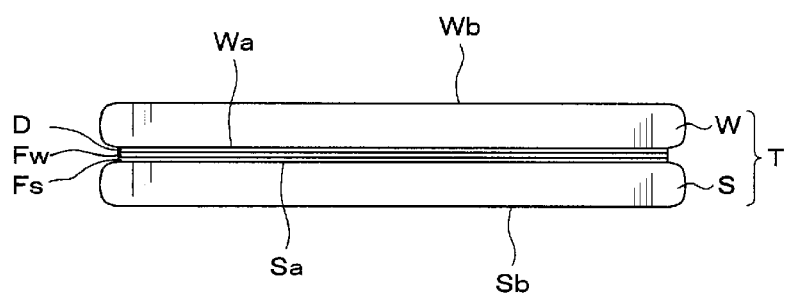
FIG. 2 is a side view schematically illustrating an example structure of a combined wafer.

The wafer processing system 1 is configured to perform a processing on a combined wafer T in which a processing target wafer W and a support wafer S are bonded to each other as illustrated in FIG. 2. In the wafer processing system 1, the processing target wafer W is separated and thinned. Hereinafter, in the processing target wafer W, a surface bonded to the support wafer S will be referred to as a front surface Wa, and a surface opposite to the front surface Wa will be referred to as a rear surface Wb. Likewise, in the support wafer S, a surface bonded to the processing target wafer W will be referred to as a front surface Sa, and a surface opposite to the front surface Sa will be referred to as a rear surface Sb. Further, in the present exemplary embodiment, the processing target wafer W corresponds to a processing target object of the present disclosure.

The processing target wafer W is a semiconductor wafer such as, but not limited to, a silicon wafer having a circular plate shape, and it has, on the front surface Wa thereof, a device layer D including a plurality of devices such as electronic circuits. Further, an oxide film Fw, for example, a $SiO_2$ film (TEOS film) is further formed on the device layer D. In the present exemplary embodiment, the processing target wafer W constitutes the aforementioned wafer as the target of separation.

The support wafer S is a wafer that supports the processing target wafer W. An oxide film Fs, for example, a $SiO_2$ film (TEOS film) is formed on the front surface Sa of the support wafer S. Further, if the support wafer S has a plurality of devices formed on the front surface Sa thereof, a device layer (not shown) is formed on the front surface Sa, the same as in the processing target wafer W.

Further, in the following description, illustration of the device layer D and the oxide films Fw and Fs may be omitted in some cases for the simplicity of illustration.

Figure 3:
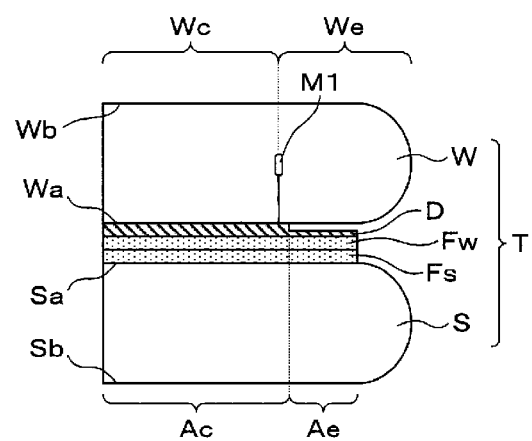
FIG. 3 is a side view schematically illustrating an example structure of a part of the combined wafer.

Further, in addition to the above-stated thinning processing, an edge trimming processing is further performed on the processing target wafer W to suppress a peripheral portion of the processing target wafer W from having a knife edge shape by the thinning processing as described above. In the edge trimming processing, as shown in FIG. 3, a peripheral modification layer M1 is formed by radiating laser light to a boundary between a peripheral portion We as a removing target and a central portion Wc, and the peripheral portion We is removed starting from this peripheral modification layer M1. Further, the peripheral portion We to be removed by the edge trimming may range from, e.g., 1 mm to 5 mm from an edge of the processing target wafer W in a diametrical direction thereof. A method of the edge trimming processing will be described later.

Here, if the processing target wafer W and the support wafer S are bonded in the peripheral portion We of the processing target wafer W, there is a likelihood that the peripheral portion We may not be removed appropriately. For the reason, a non-bonding region Ae for appropriately performing the edge trimming is formed at an interface between the processing target wafer W and the support wafer S in a portion corresponding to the peripheral portion We as the removal target in the edge trimming. Specifically, as shown in FIG. 3, a bonding region Ac in which the processing target wafer W and the support wafer S are bonded and the non-bonding region Ae in which bonding strength between the processing target wafer W and the support wafer S is reduced are formed at the interface between the processing target wafer W and the support wafer S. Further, it is desirable that an outer end of the bonding region Ac is located slightly outer than an inner end of the peripheral portion We to be removed.

The non-bonding region Ae may be formed before the bonding, for example. Specifically, by removing a bonding interface of the processing target wafer W before being subjected to the bonding through polishing or wet etching, by modifying the bonding interface through radiation of laser light thereto, or by hydrophobizing the bonding interface through application of a hydrophobic material thereon, the bonding strength is reduced to form the non-bonding region Ae. Further, the "bonding interface" where the non-bonding region Ae is formed refers to a portion of the processing target wafer W forming an interface to be actually bonded to the support wafer S.

The non-bonding region Ae may be formed after the bonding, for example. Specifically, by radiating laser light to the interface in a portion corresponding to the peripheral portion We of the processing target wafer W after the bonding, the bonding strength for the front surface Sa of the support wafer S is reduced, so that the non-bonding region Ae is formed. In addition, the non-bonding region Ae may be formed at any position in the vicinity of the bonding interface between the processing target wafer W and the support wafer S as long as a bonding force between the processing target wafer W and the support wafer S in the peripheral portion of the processing target wafer W can be appropriately reduced. That is, it is assumed that the "vicinity of the bonding interface" according to the present exemplary embodiment includes the inside of the processing target wafer W, the inside of the device layer D, the inside of an oxide film Fw, and so forth.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from the carry-in/out station 2 side) toward a negative X-axis side.

The first processing block G1 is equipped with an etching apparatus 40, a cleaning apparatus 41, and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be arranged side by side in the X-axis direction. Further, a plurality of etching apparatuses 40 and a plurality of cleaning apparatuses 41 may be respectively stacked on top of each other.

The etching apparatus 40 is configured to etch a separated surface of the processing target wafer W grounded by a processing apparatus 80 to be described later. By way of example, by supplying a chemical liquid (etching liquid) onto the separated surface, this separated surface is wet-etched. For instance, HF, $HNO_3$, $H_3PO_4$, TMAH, Choline, KOH, or the like may be used as the chemical liquid.

The cleaning apparatus 41 is configured to clean the separated surface of the processing target wafer W grounded by the processing apparatus 80 to be described later. By way of example, by bringing a brush into contact with the separated surface, the separated surface is cleaned by being scrubbed. Furthermore, a pressurized cleaning liquid may be used for the cleaning of the separated surface. In addition, the cleaning apparatus 41 may be configured to clean the rear surface Sb of the support wafer S as well as the separated surface of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60 as a processing apparatus and a wafer transfer device 70. The number and the layout of the modifying apparatus 60 is not limited to the example of the present exemplary embodiment, and a plurality of modifying apparatuses 60 may be stacked.

The modifying apparatus 60 is configured to form the non-bonding region Ae, the peripheral modification layer M1, an internal modification layer M2, and a central modification layer M3 by radiating laser light to an inside of the processing target wafer W. A detailed configuration of the modifying apparatus 60 will be elaborated later.

The wafer transfer device 70 is disposed at, for example, a positive Y-axis side of the modifying apparatus 60. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. Further, the configuration of the transfer arm 71 is not limited to the example of the present exemplary embodiment, and may vary as required. The wafer transfer device 70 is configured to be capable of transferring the combined wafer T to/from the cleaning apparatus 41, the modifying apparatus 60, and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 has a rotary table 81. The rotary table 81 is configured to be rotatable about a vertical rotation center line 82 by a rotation mechanism (not shown). Two chucks 83 each configured to attract and hold the combined wafer T are provided on the rotary table 81. The chucks 83 are arranged on a circle concentric with the rotary table 81 in a uniform manner. The two chucks 83 are configured to be moved to a delivery position 80a and a processing position 80b as the rotary table 81 is rotated. Further, each of the two chucks 83 is configured to be rotatable around a vertical axis by a rotating mechanism (not shown).

At the delivery position 80a, delivery of the combined wafer T is performed. The grinding unit 84 is disposed at the processing position 80b to grind the processing target wafer W. The grinding unit 84 is equipped with a grinder 85 having a grinding whetstone (not shown) configured to be rotated in a ring shape. Further, the grinder 85 is configured to be movable in a vertical direction along a supporting column 86. While keeping the processing target wafer W held by the chuck 83 in contact with the grinding whetstone, the chuck 83 and the grinding whetstone are respectively rotated.

The above-described wafer processing system 1 is equipped with a control device 90 as a controller. The control device 90 is implemented by, for example, a computer equipped with a CPU, a memory, and so forth, and includes a program storage (not shown). A program for controlling a processing of the processing target wafer Win the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Moreover, the aforementioned various processing apparatus may be further equipped with control devices (not shown) respectively configured to control the various processing apparatuses independently.

Figure 4:
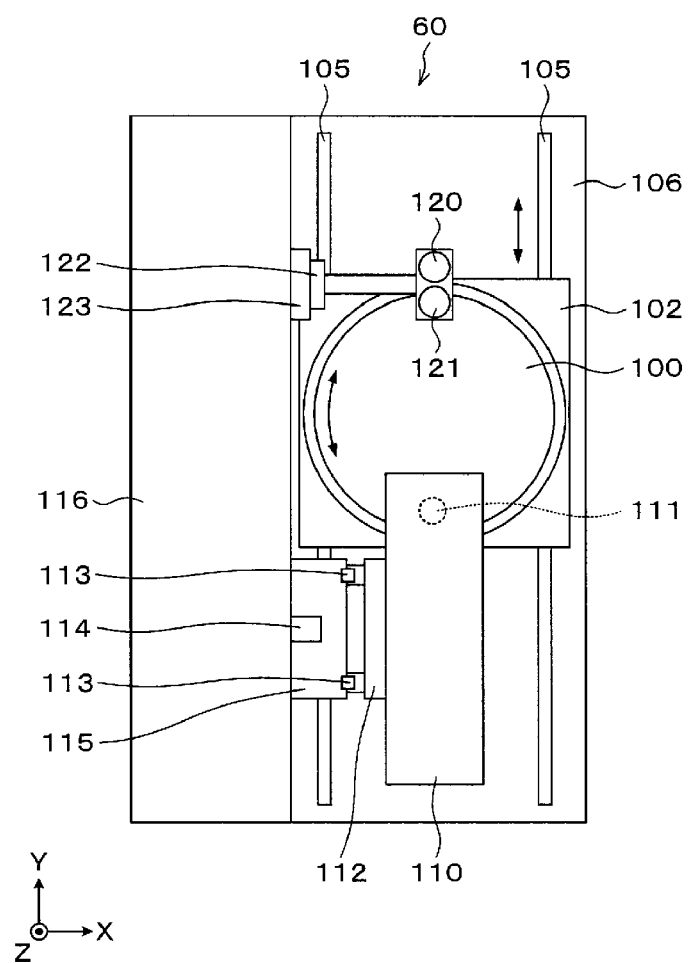
FIG. 4 is a plan view schematically illustrating a configuration example of a modifying apparatus.
Figure 5:
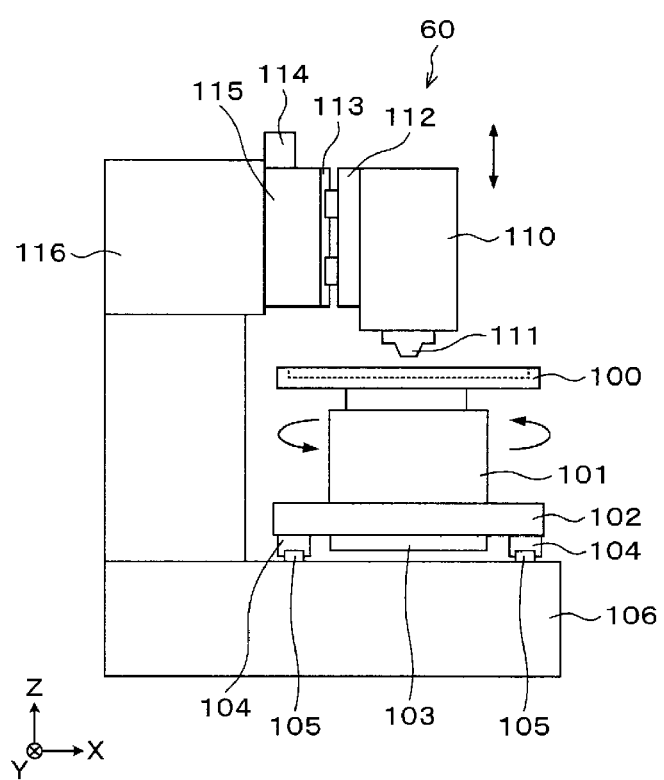
FIG. 5 is a side view schematically illustrating the configuration example of the modifying apparatus.

Now, the aforementioned modifying apparatus 60 will be described. FIG. 4 and FIG. 5 are a plan view and a side view illustrating a schematic configuration of the modifying apparatus 60, respectively.

The modifying apparatus 60 is equipped with a chuck 100 as a holder configured to hold the combined wafer T on a top surface thereof. The chuck 100 is configured to attract and hold the rear surface Sb of the support wafer S in the state that the processing target wafer W is placed at an upper side and the support wafer S is placed at a lower side. The chuck 100 is supported on a slider table 102 with an air bearing 101 therebetween. A rotating mechanism 103 is provided at a bottom surface side of the slider table 102. The rotating mechanism 103 incorporates therein, for example, a motor as a driving source. The chuck 100 is configured to be rotated around a vertical axis by the rotating mechanism 103 via the air bearing 101 therebetween. The slider table 102 is configured to be moved by a moving mechanism 104, which is provided at a bottom surface side of the slider table 102 to serve as a holder moving mechanism, along a rail 105 which is provided on a base 106 and elongated in the Y-axis direction. Further, though not particularly limited, a driving source of the moving mechanism 104 may be, for example, a linear motor.

A laser head 110 serving as a modifying device is provided above the chuck 100. The laser head 110 has a lens 111. The lens 111 is a cylindrical member provided on a bottom surface of the laser head 110, and is configured to radiate the laser light to the processing target wafer W held by the chuck 100.

The laser head 110 is configured to concentrate and radiate the laser light having a wavelength featuring transmissivity for the processing target wafer W to a preset position within the processing target wafer W as high-frequency laser light in a pulse shape oscillated from a laser light oscillator (not shown). Accordingly, a portion within the processing target wafer W to which the laser light is concentrated is modified, so that the non-bonding region Ae, the peripheral modification layer M1, the internal modification layer M2, and the central modification layer M3 are formed.

In the present exemplary embodiment, in order to avoid complication of illustration, it is assumed that the non-bonding region Ae, the peripheral modification layer M1, the internal modification layer M2, and the central modification layer M3 are formed by the common laser head 110. However, they may be formed by different laser heads. In addition, the laser heads may be used selectively depending on the type of laser light to be radiated.

The laser head 110 is supported at a supporting member 112. The laser head 110 is configured to be moved up and down by an elevating mechanism 114 along a vertically elongated rail 113. Further, the laser head 110 is configured to be moved in the Y-axis direction by a moving mechanism 115 as a modifying device moving mechanism. Each of the elevating mechanism 114 and the moving mechanism 115 is supported at a supporting column 116.

Above the chuck 100, a macro-camera 120 and a micro-camera 121 are provided at a positive Y-axis side of the laser head 110. For example, the macro-camera 120 and the micro-camera 121 are formed as one body, and the macro-camera 120 is provided at a positive Y-axis side of the micro-camera 121. The macro-camera 120 and the micro-camera 121 are configured to be moved up and down by an elevating mechanism 122, and also configured to be moved in the Y-axis direction by a moving mechanism 123.

The macro-camera 120 is configured to image an outer end portion of the processing target wafer W (combined wafer T). The macro-camera 120 is equipped with, for example, a coaxial lens, and radiates visible light, for example, red light and receives reflection light from a target object. For example, the macro-camera 120 has an image magnification of two times.

The image obtained by the macro-camera 120 is outputted to the control device 90. The control device 90 calculates a first eccentric amount between a center of the chuck 100 and a center of the processing target wafer W from the image obtained by the macro camera 120.

The micro-camera 121 is configured to image a peripheral portion of the processing target wafer W and image a boundary between the bonding region Ac and the non-bonding region Ae. The micro-camera 121 is equipped with, for example, a coaxial lens, and radiates infrared light (IR light) and receives reflection light from a target object. By way of example, the micro-camera 121 has an image magnification of 10 times. A field of view of the micro-camera 121 is about ⅕ of a field of view of the macro-camera 120, and a pixel size of the micro-camera 121 is about ⅕ of a pixel size of the macro-camera 120.

The image obtained by the micro-camera 121 is outputted to the control device 90. In the control device 90, a second eccentric amount between the center of the chuck 100 and the center of the bonding region Ac is calculated from the image obtained by the micro-camera 121. Also, the control device 90 moves the chuck 100 or the laser head 110 based on the second eccentric amount so that the center of the chuck 100 and the center of the bonding region Ac are coincident with each other. In the following description, this control of moving the chuck 100 or the laser head 110 will be sometimes referred to as eccentricity correction.

Figure 6:
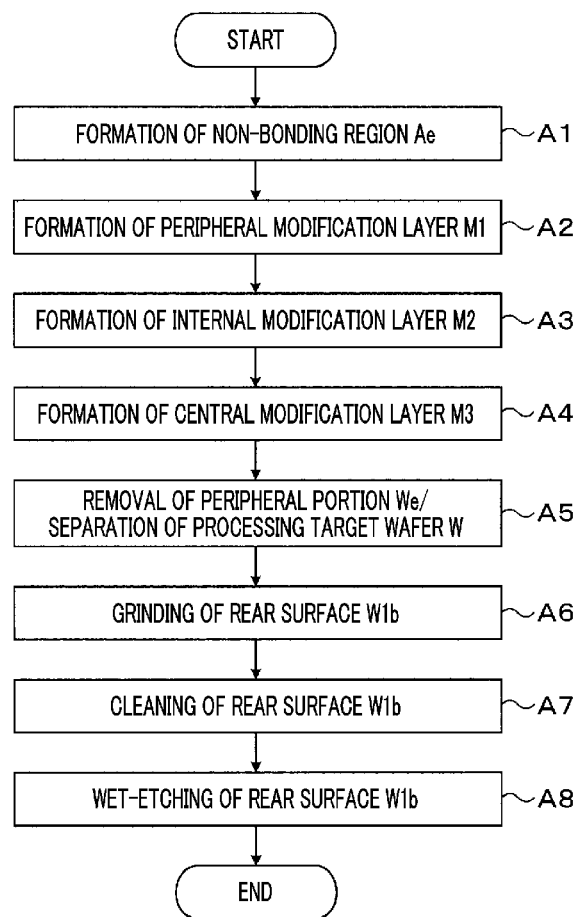
FIG. 6 is a flowchart illustrating an example of main processes of a wafer processing.

Now, a wafer processing performed by using the wafer processing system 1 configured as described above will be discussed. FIG. 6 is a flowchart illustrating main processes of the wafer processing. FIG. 7A to FIG. 7F are explanatory diagrams illustrating the main processes of the wafer processing. In the present exemplary embodiment, the combined wafer T is previously formed by bonding the processing target wafer W and the support wafer S in a bonding apparatus (not shown) at the outside of the wafer processing system 1. Further, although the combined wafer T carried into the wafer processing system 1 is already provided with the aforementioned non-bonding region Ae formed thereat, the following description will be provided for an example where the non-bonding region Ae is formed in the modifying apparatus 60.

Figure 7A:
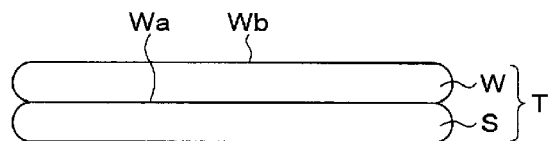
FIG. 7A to FIG. 7F are explanatory diagrams illustrating the example of the main processes of the wafer processing.

First, the cassette Ct accommodating therein the multiple number of combined wafers T shown in FIG. 7A is placed on the cassette placing table 10 of the carry-in/out station 2.

Figure 7B:
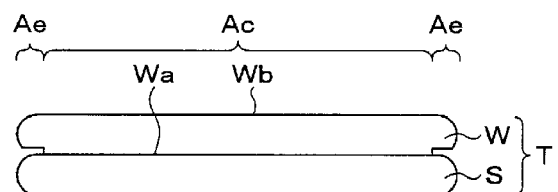
Figure 7C:
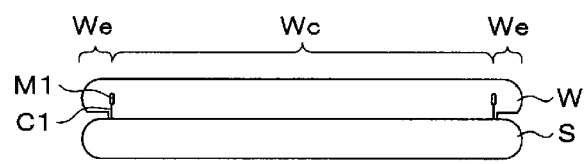
Figure 7D:
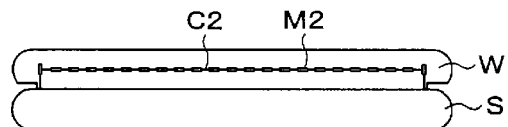

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, the non-bonding region Ae is first formed, as shown in FIG. 7B (process A1 of FIG. 6). Subsequently, a peripheral modification layer M1 is formed inside the processing target wafer W, as illustrated in FIG. 7C (process A2 of FIG. 6), an internal modification layer M2 is formed, as shown in FIG. 7D (process A3 of FIG. 6), and a central modification layer M3 is formed (process A4 of FIG. 6). The peripheral modification layer M1 serves as a starting point when the peripheral portion We is removed in the edge trimming. The internal modification layer M2 serves as a starting point for separating the processing target wafer W. The central modification layer M3 controls development of cracks in the central portion of the processing target wafer W, and serves as a starting point for the separation in the central portion of the processing target wafer W.

In the modifying apparatus 60, the combined wafer T is carried into the modifying apparatus 60 by the wafer transfer device 50, and held on the chuck 100. Then, the chuck 100 is moved to a formation position of the non-bonding region Ae. The formation position of the non-bonding region Ae is a position where the laser head 110 is capable of radiating the laser light to the peripheral portion We of the processing target wafer W.

Then, by radiating laser light L (for example, $CO_2$ laser) from the laser head 110 while rotating the chuck 100 in a circumferential direction thereof, the non-bonding region Ae is formed (process A1 of FIG. 6). In addition, as described above, the non-bonding region Ae can be formed at any position near the bonding interface as long as the bonding strength between the processing target wafer W and the support wafer S can be reduced.

Subsequently, the chuck 100 is moved to a macro-alinement position. The macro-alignment position is a position where the macro-camera 120 is capable of imaging an outer end portion of the processing target wafer W.

Thereafter, the outer end portion of the processing target wafer W is imaged by the macro-camera 120 in 360 degrees in a circumferential direction of the processing target wafer W. The obtained image is outputted to the control device 90 from the macro-camera 120.

In the control device 90, a first eccentric amount between the center of the chuck 100 and the center of the processing target wafer W is calculated from the image obtained by the macro-camera 120. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position. The micro-alignment position is a position where the micro-camera 121 is capable of imaging the peripheral portion of the processing target wafer W. Here, the field of view of the micro-camera 121 is smaller (about ⅕) than the field of view of the macro-camera 120, as stated above. Thus, if the Y-axis component of the first eccentric amount is not corrected, the peripheral portion of the processing target wafer W may not be included in an angle of view of the micro-camera 121, resulting in a failure to image the peripheral portion of the processing target wafer W with the micro-camera 121. For the reason, the correction of the Y-axis component based on the first eccentric amount is performed to move the chuck 100 to the micro-alignment position.

Subsequently, a boundary between the bonding region Ac and the non-bonding region Ae is imaged by the micro-camera 121 in 360 degrees in the circumferential direction of the processing target wafer W. The obtained image is outputted to the control device 90 from the micro-camera 121.

In the control device 90, a second eccentric amount between the center of the chuck 100 and a center of the bonding region Ac is calculated from the image obtained by the micro-camera 121. Further, in the control device 90, the position of the chuck 100 with respect to the peripheral modification layer M1 is decided based on the second eccentric amount such that the center of the bonding region Ac and the center of the chuck 100 are coincident with each other.

Then, the chuck 100 is moved to a modification position. The modification position is a position where the laser head 110 radiates laser light to the processing target wafer W to form the peripheral modification layer M1. Further, in the present exemplary embodiment, the modification position is the same as the micro-alignment position.

Figure 8:
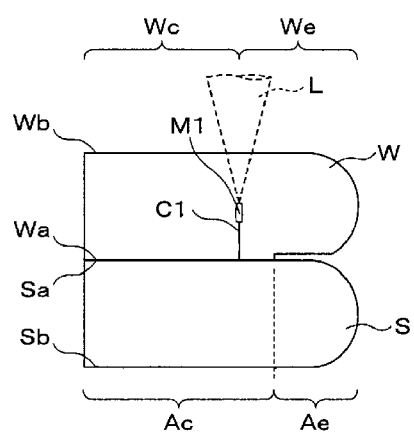
FIG. 8 is an explanatory diagram illustrating a state in which a peripheral modification layer is being formed in a processing target wafer.
Figure 9:
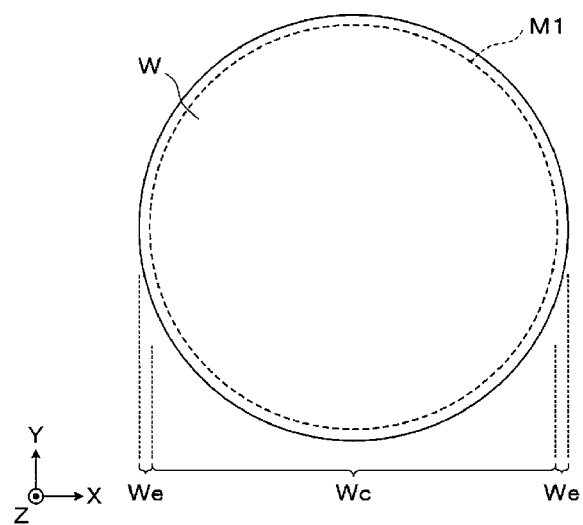
FIG. 9 is an explanatory diagram illustrating a state in which the peripheral modification layer is being formed in the processing target wafer.

Subsequently, as illustrated in FIG. 8 and FIG. 9, by radiating laser light L (for example, YAG laser) from the laser head 110, the peripheral modification layer M1 is formed at the boundary between the peripheral portion We and the central portion We of the processing target wafer W (process A2 of FIG. 6). Further, within the processing target wafer W, a crack C1 develops from the peripheral modification layer M1 in a thickness direction of the processing target wafer W. The crack C1 reaches the front surface Wa but does not reach the rear surface Wb.

A lower end of the peripheral modification layer M1 formed by the laser light L is located above a surface of the separated processing target wafer W after being finally processed. That is, the formation position of the peripheral modification layer M1 is adjusted such that the peripheral modification layer M1 is not left in the first separation wafer W1 after being separated (more specifically, after a grinding processing to be described later).

In the process A2, to locate the chuck 100 at the position decided by the control device 90, the chuck 100 is rotated by the rotating mechanism 103 so that the center of the bonding region Ac and the center of the chuck 100 are coincident, and, also, the chuck 100 is moved in the Y-direction by the moving mechanism 104 (eccentricity correction). At this time, the rotation of chuck 100 and the movement of the chuck 100 in the Y-axis direction are synchronized.

While performing the eccentricity correction of the chuck 100 (processing target wafer W) as described above, the laser light L is radiated to the inside of the processing target wafer W from the laser head 110. That is, while correcting the second eccentric amount, the peripheral modification layer M1 is formed. The peripheral modification layer M1 is formed in a ring shape to be concentric with the bonding region Ac. Accordingly, the peripheral portion We can be appropriately removed later, starting from the peripheral modification layer M1 (crack C1).

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

Figure 10:
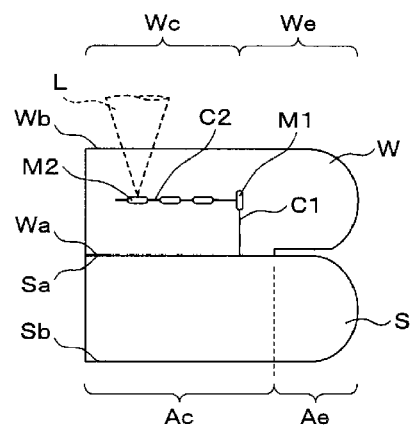
FIG. 10 is an explanatory diagram illustrating a state in which an internal modification layer is being formed in the processing target wafer.
Figure 11:
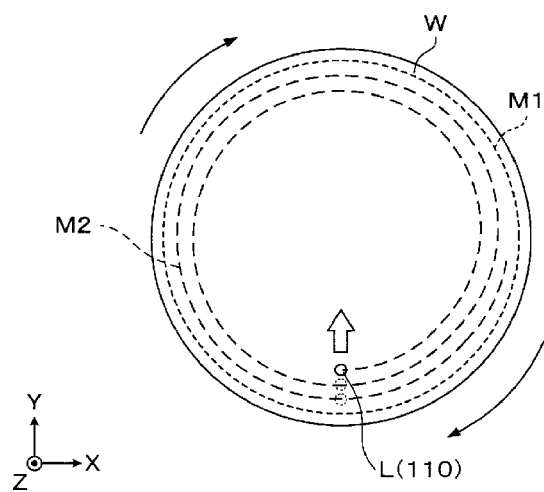
FIG. 11 is an explanatory diagram illustrating a state in which the internal modification layer is being formed in the processing target wafer.

Thereafter, as depicted in FIG. 10 and FIG. 11, by radiating laser light L (for example, YAG laser) from the laser head 110, the internal modification layer M2 is formed along a plane direction of the processing target wafer W (process A3 of FIG. 6). Black arrows shown in FIG. 11 indicate a rotation direction of the chuck 100, and a white arrow indicates a movement direction of a processing point according to the movement of the chuck 100 or the laser head 110. Further, within the processing target wafer W, a crack C2 develops from the internal modification layer M2 along the plane direction. The cracks C2 develop only inside the peripheral modification layer M1 in the diametrical direction.

Figure 12:
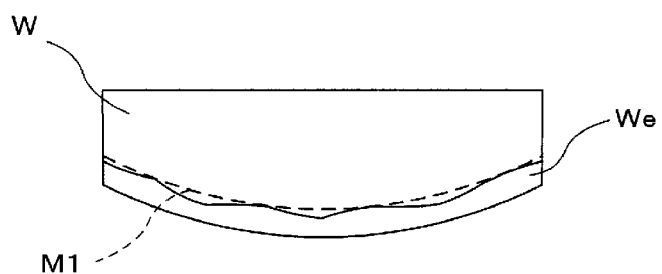
FIG. 12 is an explanatory diagram illustrating a state in which a periphery of the processing target wafer is being removed.

In addition, if the internal modification layer M2 is formed at a diametrically outer side than the peripheral modification layer M1, the quality of the edge trim after the peripheral portion We is removed may be degraded, as illustrated in FIG. 12. That is, the peripheral portion We may not be appropriately removed starting from the peripheral modification layer M1 (crack C1), and a part of the peripheral portion We may remain on the support wafer S. From this point of view, the formation position of the internal modification layer M2 is adjusted so that it is formed at a diametrically inner side than the peripheral modification layer M1.

Furthermore, a lower end of the internal modification layer M2 formed by the laser light L is located above the surface of the separated processing target wafer W after being finally processed. That is, the formation position of the internal modification layer M2 is adjusted such that the internal modification layer M2 is not left within the first separation wafer after being separated (more specifically after the grinding processing to be described later).

In the process A3, by radiating the laser light L periodically to the inside of the processing target wafer W from the laser head 110 while rotating the chuck 100 (processing target wafer W) and moving the laser head 110 in the Y-axis direction from a diametrically outer side of the processing target wafer W toward a diametrically inner side thereof, the internal modification layer M2 is formed in a spiral shape along the plane direction of the processing target wafer W.

Details of the method of forming the internal modification layers M2 will be described later.

In the present exemplary embodiment, in forming the internal modification layer M2, the chuck 100 or the laser head 110 is moved in the Y-axis direction. More specifically, between the chuck 100 and the laser head 100, the same member as moved in the eccentricity correction is moved. That is, in the formation of the internal modification layer M2, the eccentricity correction and the formation of the internal modification layer M2 are simultaneously controlled on one axis, as will be described later. Further, although the chuck 100 is rotated in forming the internal modification layer M2, the laser head 110 may be moved to rotate the laser head 110 relative to the chuck 100.

In addition, when separating the processing target wafer W starting from the internal modification layer M2 as will be described later, it is desirable that an interval (pitch) of the internal modification layers M2 is set to be uniform in order to perform the separation of the processing target wafer W uniformly within the surface of the processing target wafer W. Thus, in the process A3, by controlling a rotation speed of the chuck 100 and a frequency of the laser light L, the interval between the internal modification layers M2 is adjusted. That is, when a position of the laser head 110 in the diametrical direction (that is, a radiation position of the laser light L) is located at an outer periphery of the processing target wafer W, the rotation speed is reduced, whereas when the position of the laser head 110 in the diametrical direction is located at the central portion of the processing target wafer W, the rotation speed is increased. In addition, when the position of the laser head 110 in the diametrical direction (that is, the radiation position of the laser light L) is located at the outer periphery of the processing target wafer W, the frequency of the laser light L is increased, whereas when the position of the laser head 110 in the diametrical direction is located at the central portion of the processing target wafer W, the frequency is reduced.

Figure 13A:
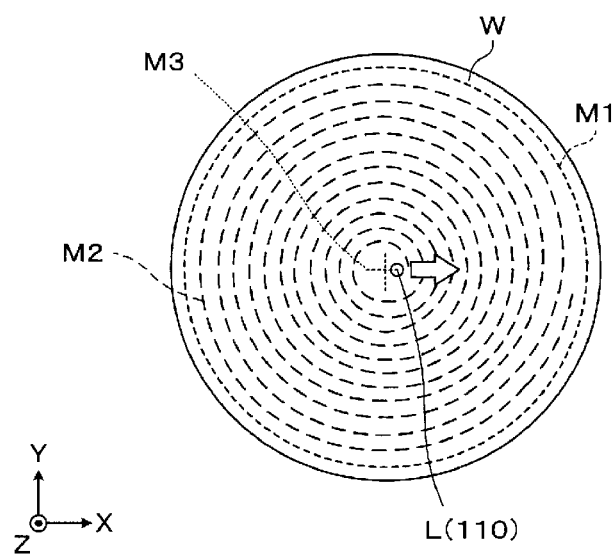
FIG. 13A and FIG. 13B are explanatory diagrams illustrating a state in which a central modification layer is being formed in the processing target wafer.
Figure 13B:
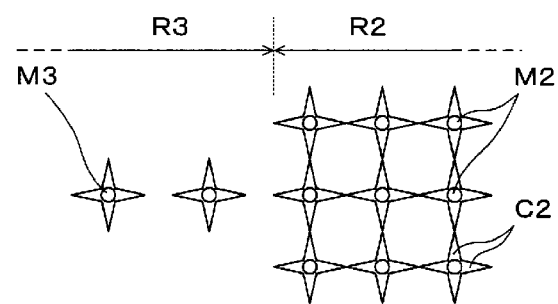

If the internal modification layers M2 are formed in the processing target wafer W, the laser light L (for example, YAG laser) is radiated from the laser head 110 to form the central modification layers M3 along the plane direction of the processing target wafer W, as shown in FIG. 13A and FIG. 13B (process A4 of FIG. 6). Within the processing target wafer W, cracks C3 develop from the central modification layers M3 in the plane direction. The central modification layers M3 are formed to be spaced apart from each other (for example, 10 μm or more) so that the cracks C3 are not connected to each other and are not connected to the cracks C2.

In the process A4, the rotation of the chuck 100 (processing target wafer W) is stopped, and by radiating the laser light L from the laser head 110 to the inside of the processing target wafer W while moving the laser head 110 in horizontal directions (the X-axis direction and the Y-axis direction) above the processing target wafer W, the central modification layer M3 is formed in a straight line shape in the plane direction. Details of this method of forming the central modification layer M3 in the process A4 will be discussed later.

In the formation of the central modification layer M3, the chuck 100 may be moved in the horizontal directions instead of the laser head 110.

After the central modification layer M3 is formed in the processing target wafer W, the combined wafer T is then carried out of the modifying apparatus 60 by the wafer transfer device 70.

Figure 7E:
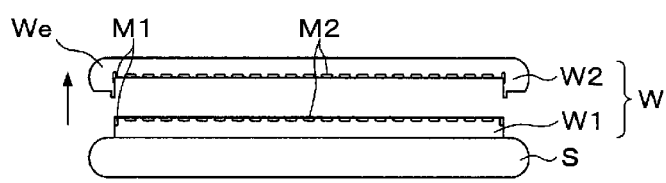

Then, the combined wafer T is transferred into the processing apparatus 80 by the wafer transfer device 70. In the processing apparatus 80, when the combined wafer T is delivered from the transfer ram 71 onto the chuck 83, the processing target wafer W is separated into the first separation wafer W1 and the second separation wafer W2, starting from the peripheral modification layer M1 and the internal modification layer M2 (process A5 of FIG. 6), as illustrated in FIG. 7E. At this time, the peripheral portion We is also removed from the processing target wafer W. Here, since the non-bonding region Ae is formed in the vicinity of the bonding interface between the processing target wafer W and the support wafer S, the peripheral portion We can be easily detached, so that the separation of the processing target wafer W can be carried out appropriately.

Figure 14A:
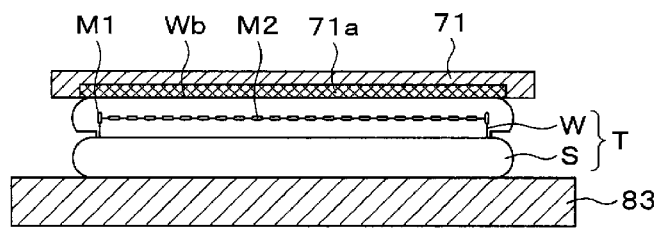
FIG. 14A and FIG. 14B are explanatory diagrams illustrating a state in which the processing target wafer is being separated.
Figure 14B:
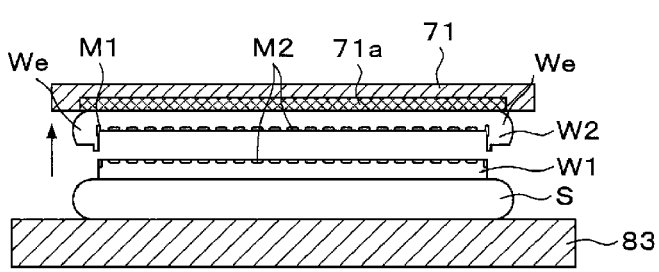

In the process A5, the support wafer S is attracted to and held by the chuck 83 while the processing target wafer W is attracted to and held with an attraction surface 71a of the transfer arm 71, as shown in FIG. 14A. Then, as shown in FIG. 14B, the transfer arm 71 is raised in the state that the rear surface Wb of the processing target wafer W is attracted to and held by the attraction surface 71a, so that the processing target wafer W is separated into the first separation wafer W1 and the second separation wafer W2. In the process A5 as stated above, the second separation wafer W2 is separated as one body with the peripheral portion We. That is, the removal of the peripheral portion We and the separation (thinning) of the processing target wafer W are performed at the same time.

The separated second separation wafer W2 is collected to, for example, the outside of the wafer processing system 1. By way of example, a collector (not shown) may be provided within a movable range of the transfer arm 71, and the separated second separation wafer W2 may be collected by releasing the attraction of the second separation wafer W2 in the collector.

In the present exemplary embodiment, the processing target wafer W is separated by using the wafer transfer device 70 in the processing apparatus 80. However, a separation apparatus (not shown) for separating the processing target wafer W may be provided in the wafer processing system 1. This separation apparatus may be stacked on, for example, the modifying apparatus 60.

Figure 7F:
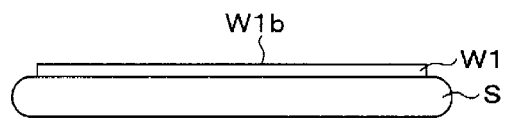

Next, the chuck 83 is moved to the processing position 80b. Then, as shown in FIG. 7F, a rear surface W1b as a separated surface of the first separation wafer W1 held by the chuck 83 is ground by the grinding unit 84, and the peripheral modification layer M1, the internal modification layer M2, and the central modification layer M3 remaining on the rear surface W1b are removed (process A6 of FIG. 6). In the process A6, by respectively rotating the first separation wafer W1 and the grinding whetstone while keeping the grinding whetstone in contact with the rear surface W1b, the rear surface W1b is ground. Further, the rear surface W1b of the first separation wafer W1 may be then cleaned with a cleaning liquid by using a cleaning nozzle (not shown).

Subsequently, the combined wafer T is transferred to the cleaning apparatus 41 by the wafer transfer device 70. In the cleaning apparatus 41, the rear surface W1b of the first separation wafer W1 as the separated surface is scrub-cleaned (process A7 of FIG. 6). Further, in the cleaning apparatus 41, the rear surface Sb of the support wafer S as well as the rear surface W1b of the first separation wafer W1 may be cleaned.

Afterwards, the combined wafer T is transferred to the etching apparatus 40 by the wafer transfer device 50. In the etching apparatus 40, the rear surface W1b of the first separation wafer W1 as the separated surface is wet-etched by a chemical liquid (process A8 of FIG. 6). A grinding mark may be formed on the rear surface W1b ground by the aforementioned processing apparatus 80. In the process A8, the grinding mark can be removed by performing the wet-etching, so that the rear surface W1b can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

In the above-described exemplary embodiment, the processing sequence of the processes A1 to A8 may be appropriately changed.

As a first modification example, the order of the formation of the peripheral modification layer M1 in the process A2 and the formation of the internal modification layer M2 in the process A3 may be reversed. In this case, the wafer processing is performed in the order of the process A1, the process A3, the process A2, and the processes A4 to A8.

As a second modification example, the formation of the central modification layer M3 in the process A4 may be performed before the formation of the peripheral modification layer M1 in the process A2. In this case, the wafer processing is performed in the order of the process A1, the process A4, the processes A2 and A3, and the processes A5 to A8.

As a third modification example, the formation of the central modification layer M3 in the process A4 may be performed before the formation of the internal modification layer M2 in the process A3. In this case, the wafer processing is performed in the order of the processes A1 and A2, the process A4, the process A3, and the processes A5 to A8.

As a fourth modification example, the formation of the non-bonding region Ae in the process A1 may be performed after the formation of the peripheral modification layer M1 in the process A2. In this case, the wafer processing is performed in the order of the process A2, the process A1, and the processes A3 to A8.

As a fifth modification example, the formation of the non-bonding region Ae in the process A1 may be performed after the formation of the internal modification layer M2 in the process A3. In this case, the wafer processing is performed in the order of the processes A2 and A3, the process A1, and the processes A4 to A8.

Further, in the above-described exemplary embodiment, the processings of the processes A1 to A8 may be appropriately omitted.

As a first example of the omission, the removal of the peripheral modification layer M1, the internal modification layer M2 and the central modification layer M3 in the process A6 may be carried out by the wet etching in the process A8. In this case, the grinding processing of the process A6 may be omitted.

As a second example of the omission, if the peripheral modification layer M1, the internal modification layer M2, and the central modification layer M3 are properly removed and no grinding mark is formed in the grinding processing of the process A6, the wet etching of the process A8 may be omitted.

As a third example of the omission, if the combined wafer T having the non-bonding region Ae formed therein is carried into the wafer processing system 1, the formation of the non-bonding region Ae in the process A1 may be omitted.

Further, if the formation of the non-bonding region Ae is performed after the alignment of the processing target wafer W in the modifying apparatus 60 as in the above-described modification examples 4 and 5, the above-described micro-alignment (calculation of the second eccentric amount between the center of the chuck 100 and the bonding region Ac by imaging the boundary of the non-bonding region Ae) may be omitted. In this case, the formation of the peripheral modification layer M1 in the process A2 may be carried out based on the result of the macro-alignment.

Figure 15A:
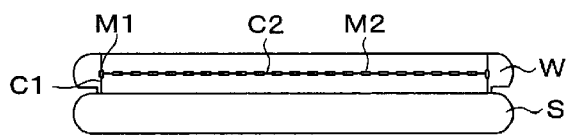
FIG. 15A and FIG. 15B are explanatory diagrams illustrating another method of separating the processing target wafer.
Figure 15B:
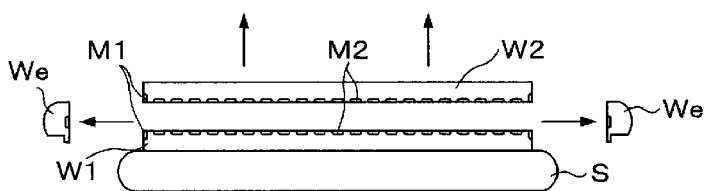

Furthermore, in the process A5 of the above-described exemplary embodiment, the second separation wafer W2 is separated as one body with the peripheral portion We, that is, the removal of the peripheral portion We and the thinning of the processing target wafer W are performed at the same time. However, the second separation wafer W2 and the peripheral portion We do not have to be separated at the same time. For example, the second separation wafer W2 may be separated after the peripheral portion We is removed by the edge trimming. In this case, by allowing the crack C1 developing from the peripheral modification layer M1 formed in the process A2 to reach the front surface Wa and the rear surface Wb as shown in FIG. 15A, the edge trimming processing and the thinning processing can be performed appropriately, as illustrated in FIG. 15B. There may be a case where the peripheral portion We need not be removed. In this case, the alignment of the processing target wafer W may be performed by the outer end of the processing target wafer W instead of the boundary between the bonding region Ac and the non-bonding region Ae.

In addition, in the above-described exemplary embodiment, though both the horizontal (Y-axis direction) movement in forming the internal modification layer M2 and the horizontal (Y-axis direction) movement in performing the eccentricity correction are performed by either the chuck 100 or the laser head 110 on one axis, these horizontal movements may be performed on two axes. By way of example, the laser head 110 may perform the horizontal movement for the formation of the internal modification layer M2, and the chuck 100 may perform the horizontal movement for the eccentricity follow-up. Alternatively, the chuck 100 may perform the horizontal movement for the formation of the internal modification layer M2, and the laser head 110 may perform the horizontal movement for the eccentricity follow-up.

Figure 16:
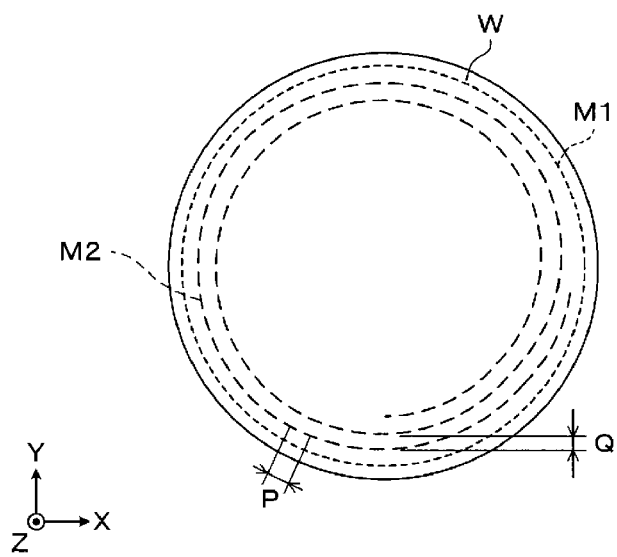
FIG. 16 is an explanatory diagram illustrating the formed internal modification layer.

Now, the method of forming the internal modification layer M2 in the process A3 will be described. In the process A3, the internal modification layer M2 is formed in the spiral shape, as stated above. As shown in FIG. 16, an interval between the internal modification layers M2 adjacent in the circumferential direction will be referred to as a circumferential interval P (pulse pitch), and an interval between the internal modification layers M2 adjacent in the diametrical direction will be referred to as a diametrical interval Q (index pitch).

As described above, the internal modification layer M2 needs to be formed at the diametrically inner side than the peripheral modification layer M1 in order to suppress quality deterioration of the edge trim. However, when the centers of the chuck 100 and the processing target wafer W are not coincident, that is, when the correction of the first and second eccentric amounts by the control device 90 is not properly performed, the modification layers may be formed eccentrically with respect to the processing target wafer W. When the modification layers is formed without taking such eccentricity into consideration, there is a likelihood that the internal modification layer M2 is formed at the diametrically outer side than the peripheral modification layer M1.

Thus, in the modifying apparatus 60, in order to suppress the internal modification layers M2 from being formed at the diametrically outer side than the peripheral modification layer M1, eccentricity correction is performed when forming the modification layers. Such eccentricity correction is carried out by moving the chuck 100 and the laser head 110 in the horizontal directions (X-axis direction and Y-axis direction), for example.

Figure 17:
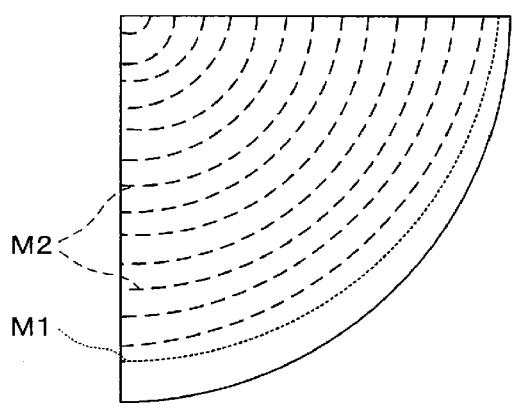
FIG. 17 is an explanatory diagram illustrating a first eccentricity correction method.

FIG. 17 is an explanatory diagram showing a state of modification layers formed within the processing target wafer W by a first eccentricity correction method.

When the centers of the chuck 100 and the processing target wafer W do not coincide with each other, the non-bonding region Ae is formed eccentrically with respect to the processing target wafer W in the process A1. As stated above, the peripheral modification layer M1 is formed in a ring shape to be concentric with the bonding region Ac (non-bonding region Ae) in the process A2. Accordingly, in the process A3, the internal modification layers M2 are formed in the spiral shape along the peripheral modification layer M1 to be concentric with the bonding region Ac and the peripheral modification layer M1. That is, in the first eccentricity correction method, both the peripheral modification layer M1 and the internal modification layers M2 are formed while the eccentricity correction thereof is performed.

As described above, according to the first eccentricity correction method, by forming the internal modification layers M2 to be concentric with the peripheral modification layer M1 which is formed to follow the eccentricity of the bonding region Ac, the formation of the internal modification layers M2 at the diametrically outer side than the peripheral modification layer M1 can be suppressed.

As described in the first eccentricity correction method, it is desirable that the internal modification layers M2 are formed to follow the eccentricity. If, however, the internal modification layers M2 are formed in the center portion of the processing target wafer W to follow this eccentricity, it is necessary to reciprocate the chuck 100 and the laser head 110 in the horizontal directions at a high speed. As a result, there are concerns that the eccentricity correcting operation may not be able to keep up with the operation of forming the internal modification layers M2, and resonance and guide lifetime may be reduced. Therefore, in a second eccentricity correction method to be described below, the eccentricity correcting operation is not performed at least in the center of the processing target wafer W.

Figure 18:
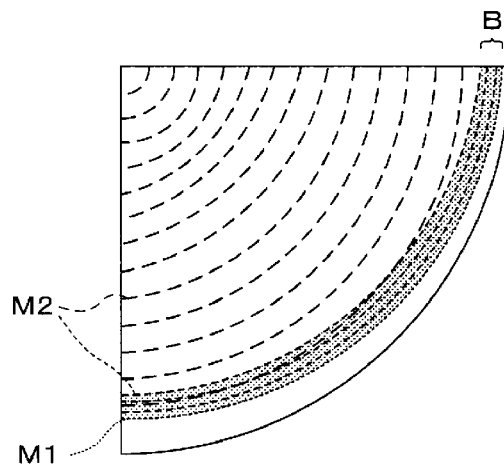
FIG. 18 is explanatory diagram illustrating a second eccentricity correction method.

FIG. 18 is an explanatory diagram showing a state of modification layers formed within the processing target wafer W by the second eccentricity correction method.

When the centers of the chuck 100 and the processing target wafer W are not coincident, the non-bonding region Ae is formed eccentrically with respect to the processing target wafer W in the process A1. As stated above, the peripheral modification layer M1 is formed in the ring shape to be concentric with the bonding region Ac (non-bonding region Ae) in the process A2.

Figure 19:
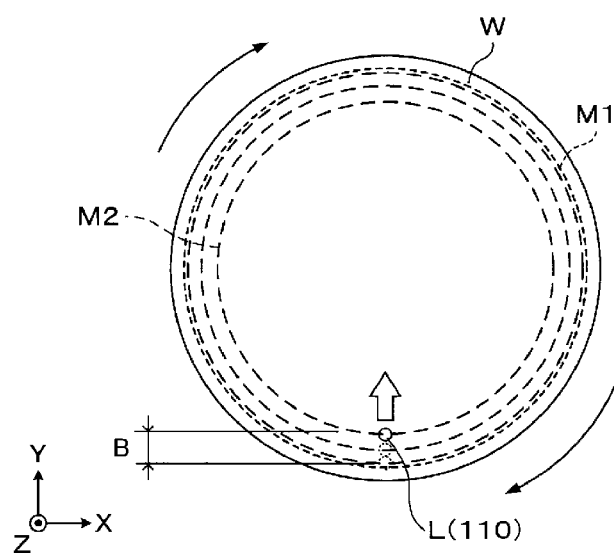
FIG. 19 is an explanatory diagram illustrating a method of forming the internal modification layer in the second eccentricity correction method.

Subsequently, in the second eccentricity correction method, a buffer layer B as a first internal modification layer for absorbing the eccentricity of the bonding region Ac is formed at a diametrically inner side of the processing target wafer W along the peripheral modification layer M1 while correcting the eccentricity of the chuck 100 (processing target wafer W). To elaborate, after the rotation speed of the chuck 100 is rate-controlled (becomes constant) after its rotation is begun, the laser light L is periodically radiated to the inside of the processing target wafer W from the laser head 110 while rotating the chuck 100 (processing target wafer W) one round (360 degrees) at least, as shown in FIG. 19, so that the annular internal modification layer M2 is formed. Then, the laser head 110 is relatively moved inwards in the diametrical direction of the processing target wafer W (Y-axis direction). By forming the internal modification layers M2 in the plane direction in a certain processing width while repeating the formation of the annular internal modification layer M2 and the inward movement of the laser head 110 in the diametrical direction, the internal modification layers M2 as the buffer layer B are formed to be concentric with the bonding region Ac and the peripheral modification layer M1, as illustrated in FIG. 18 and FIG. 19. Moreover, the buffer layer B is formed in the processing width (for example, 500 μm) equal to or larger than the eccentric amount of the bonding region Ac, for example.

Further, the diametrical interval Q of the internal modification layers M2 in the buffer layer B may be set as required.

After the buffer layer B is formed, the internal modification layer M2 as a second internal modification layer is formed in a spiral shape from a certain point within the processing width of the buffer layer B, for example. In the formation of this spiral-shaped internal modification layer M2, the above-described eccentricity correction is not performed. That is, in the second eccentricity correction method, the internal modification layers M2 of the concentric circle shapes forming the buffer layer B and the peripheral modification layer M1 are formed while performing the eccentricity correction, whereas the spiral-shaped internal modification layers M2 formed at the diametrically inner side than the buffer layer B are formed without performing the eccentricity correction.

As described above, according to the second eccentricity correction method, by forming, at the diametrically inside of the peripheral modification layer M1, the buffer layer B which is formed in the processing width equal to or larger than the eccentric amount of the bonding region Ac, it is not necessary to perform the eccentricity correction in the formation of the spiral-shaped internal modification layer M2. That is, even if the internal modification layer M2 is formed eccentrically, since the eccentric amount is absorbed in the processing width of the buffer layer B, the internal modification layer M2 does not extend to the diametrically outer side than the peripheral modification layer M1. Further, since the eccentricity correction need not be performed in the formation of the internal modification layer M2, the internal modification layer M2 can be formed more easily.

Further, by eliminating the need to perform the eccentricity correction in the central portion of the processing target wafer W, the aforementioned failure in properly performing the eccentricity correction can be suppressed. Furthermore, the concerns for the occurrence of resonance and the reduction of the guide lifetime can be reduced. Additionally, since the eccentricity correction is not performed in the central portion as described above, the high rotation speed of the chuck 100 can be maintained, and as a result, the circumferential interval P of the internal modification layers M2 can be regulated constant.

Figure 20:
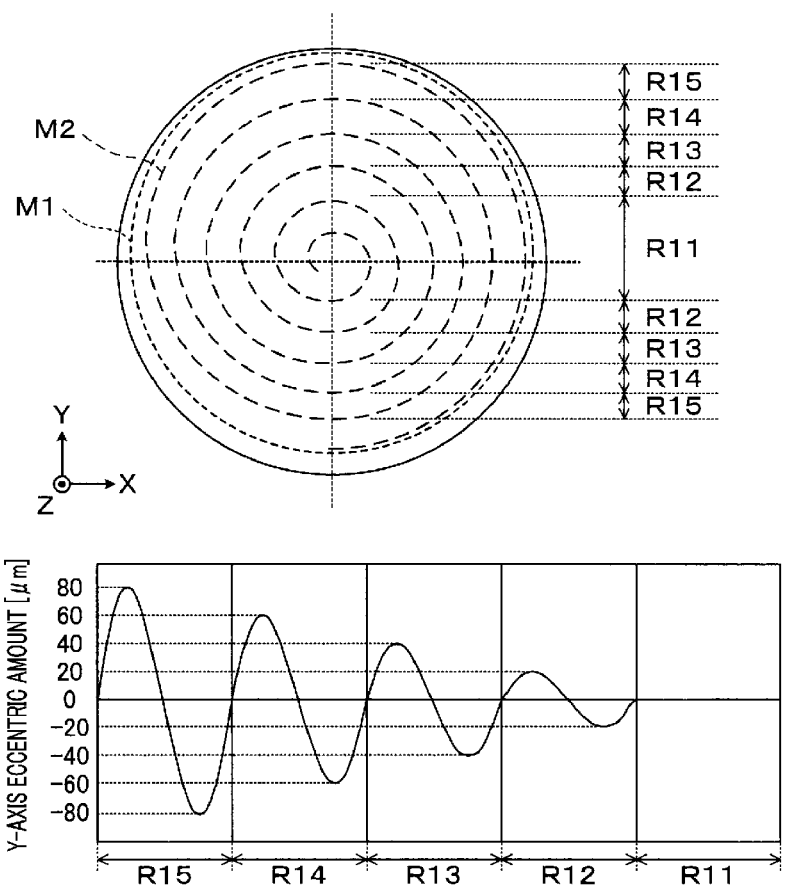
FIG. 20 is an explanatory diagram illustrating a third eccentricity correction method.

FIG. 20 is an explanatory diagram illustrating a state of modification layers formed within the processing target wafer W by a third eccentricity correction method.

When the centers of the chuck 100 and the processing target wafer W are not coincident, the non-bonding region Ae is formed eccentrically with respect to the processing target wafer W in the process A1. The peripheral modification layer M1 is annularly formed in the process A2 to be concentric with the bonding region Ac (non-bonding region Ae) as stated above.

Subsequently, in the third eccentricity correction method, at the diametrically inner side than the peripheral modification layer M1 which is annularly formed to be concentric with the bonding region Ac (non-bonding region Ae) in the process A2, eccentricity correction is performed in a range where the laser head 110 is located at an outer periphery of the processing target wafer W. That is, while moving the laser head 110 from the diametrically outer side toward the diametrically inner side, the chuck 100 is rotated by the rotating mechanism 103 so that the center of the chuck 100 and the center of the bonding region Ac coincide with each other, and, also, the chuck 100 is moved in the Y-axis direction by the moving mechanism 104.

To elaborate, a formation range of the internal modification layer M2 in the processing target wafer W is divided into a plurality of regions along the diametrical direction, and an eccentric stroke is reduced gradually along these regions. FIG. 20 illustrates an example where the formation range of the internal modification layers M2 is divided into a central region R11 and four annular regions R12 to R15, and an eccentric amount of 100 μm is corrected by every 20 μm in each of the annular regions R12 to R15, that is, an example where the eccentric stroke is attenuated by 20 μm.

As described above, according to the third eccentricity correction method, by performing the eccentricity correction in the range included in the outer periphery of the processing target wafer W (the annular regions R12 to R15 in FIG. 20), it is not necessary to perform the eccentricity correction near the central portion of the processing target wafer W. That is, at the outer periphery of the processing target wafer W, the above-described eccentricity correction (attenuation of the eccentric stroke) is completed, so the eccentric amount is 0 μm. In the central portion (central region R11 in FIG. 20), the centers of the chuck 100 and the bonding region Ac coincide with each other. When forming the internal modification layer M2 as described above, the rotation speed of the chuck 100 is low when the laser head 110 is located at the outer periphery of the processing target wafer W. Therefore, the eccentricity correction can be appropriately carried out. As a result, the eccentric amount can be absorbed, and the internal modification layer M2 can be formed inside the peripheral modification layer M1. At this time, since the eccentricity correction is not performed in the central portion, the high rotation speed of the chuck 100 can be maintained, and, as a consequence, the circumferential interval P of the internal modification layer M2 can be controlled constant.

Further, by removing the need to perform the eccentricity correction in the central region R11 of the processing target wafer W, the failure in properly performing the eccentricity correction as described above can be suppressed. Furthermore, the concerns for the occurrence of the resonance and the reduction of the guide lifetime can be reduced.

Moreover, the number of the annular regions for performing the eccentricity correction is not limited to the example of the present exemplary embodiment, and it can be selected as required. In addition, the eccentricity need not necessarily be corrected in a step manner for the annular regions as in the present exemplary embodiment. The eccentricity correction may be continuously performed from the outer periphery of the processing target wafer W toward the center thereof. As an example, the eccentricity correction may be performed for the time during which the laser head 110 radiates the laser light L several rounds from the outer side of the processing target wafer W.

In addition, when correcting the eccentric amount at the outer periphery of the processing target wafer W by the third eccentricity correction method, it is desirable that the eccentricity correction is completed up to the half (r/2) of a radius of the processing target wafer W. That is to say, it is desirable that the radius of the central region R11 shown in FIG. 20 is equal to or larger than r/2.

The internal modification layer M2 in the process A3 is formed as described above. In this way, by performing the eccentricity correction in the formation of the internal modification layer M2, the edge trimming processing and the thinning processing can be easily carried out. Moreover, for this reason, it becomes easy to maintain the quality of the edge trimming processing and the thinning processing, and control in both processings can be simplified.

Now, the method of forming the central modification layer M3 in the process A4 will be elaborated.

As described above, in order to perform the separation of the processing target wafer W uniformly within the surface thereof, it is desirable that a formation interval of the internal modification layers M2 is uniform. To control this formation interval to be constant, the rotation speed of the chuck 100 and the frequency of the laser light L are controlled in the formation of the internal modification layers M2 in the process A3.

However, when the rotation speed of the chuck 100 reaches an upper limit and the frequency of the laser light L reaches a lower limit, the circumferential interval P of the internal modification layers M2 reaches a threshold at which it can be no more enlarged. In this state, if the radiation position of the laser light L is moved inwards in the diametrical direction, the circumferential interval P decreases, so that the internal modification layers M2 may overlap on the same processing line in the central portion of the processing target wafer W. As a result, the central portion of the processing target wafer W may not be properly separated.

The reason why the central portion of the processing target wafer W cannot be separated will be described in further detail. For example, when the internal modification layers M2 are formed to be overlapped, that is, when the radiation of the next (second) laser light L is overlapped with the first formed internal modification layer M2, it becomes difficult for the cracks C2 to develop in the diametrical direction. For another example, even if the internal modification layers M2 are not overlapped, if the circumferential interval P is smaller than a certain threshold, the next (second) laser light L is radiated to the cracks C2 which is developing from the first formed internal modification layer M2. In this case, since the laser light L is radiated to the cracks C2 from which a stress is already released, it becomes difficult again for the cracks C2 to develop in the diametrical direction. For these reasons, since the cracks C2 may not be properly developed in the central portion of the processing target wafer W, there may arise a case when the central portion of the processing target wafer W may not be separated.

Further, if the internal modification layers M2 are formed to be overlapped as described above, transmitted light of the next (second) laser light L may be generated, and some of the laser light may be transmitted downwards, affecting the device layer D.

Figure 21:
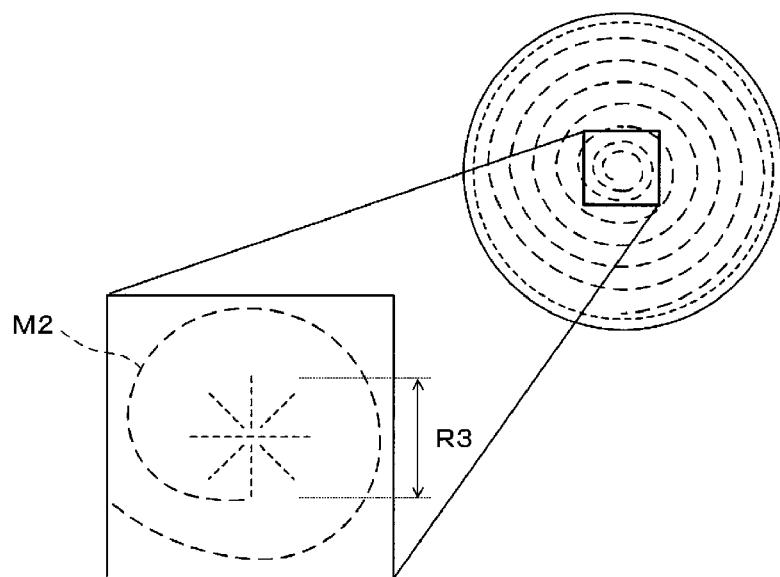
FIG. 21 is an explanatory diagram illustrating a state in which the central modification layer is being formed in the processing target wafer.

Thus, the present inventors have come up with a method of forming the central modification layer M3 as a way to separate the central portion of the processing target wafer W properly. That is, the formation of the internal modification layer M2 is terminated near the central portion of the processing target wafer W where the circumferential interval P reaches the threshold, and the central modification layer M3 is formed at the diametrically inside of the internal modification layer M2, as illustrated in FIG. 21. A formation region R3 of the central modification layer M3 shown in FIG. 21 may be calculated from the minimum value of the frequency of the laser light L and the maximum value of the rotation speed of the chuck 100 (for example, a range of about 1 mm to 2 mm from the center of the processing target wafer W).

In this way, by terminating the formation of the internal modification layer M2 at the required position calculated from the rotation speed of the chuck 100 and the frequency of the laser light, the overlapping of the formed internal modification layers M2 can be suppressed so that the processing target wafer W can be separated properly, and generation of the transmitted light of the laser light L can be suppressed. Further, by forming the central modification layer M3 at the diametrically inside of the internal modification layers M2, the cracks C2 that develop from the internal modification layers M2 can be suppressed from being connected in the central portion of the processing target wafer W to form a protruding portion.

Figure 22:
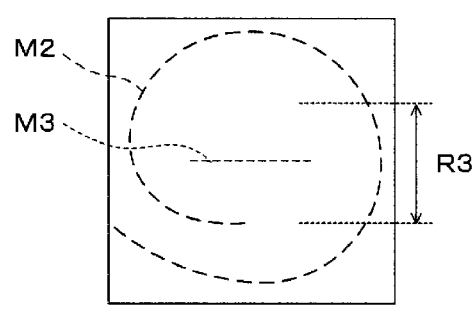
FIG. 22 is an explanatory diagram illustrating another example of forming the central modification layer.

Furthermore, the central modification layer M3 may be formed to have any of various shapes at the diametrically inside of the internal modification layers M2. For example, although the central modification layer M3 is formed by a plurality of, for example, seven straight lines in the example shown in FIG. 21, the shape of the central modification layer M3 may not be limited thereto. By way of example, the central modification layer M3 may be formed by less than 7, for example, as shown in FIG. 22, only one straight line as long as the separation of the processing target wafer W in the central portion thereof can be performed appropriately. As stated above, by reducing the number of the central modification layer M3 to be formed, tact for the formation of the central modification layer M3 can be reduced. Moreover, the shape of the central modification layer M3 is not limited to the straight line shape, and it may be formed to have, for example, only a curved shape or a combination of the straight line shape and the curved shape.

Here, if processing lines of the central modification layers M3 are formed to cross each other, there is a likelihood that the multiple central modification layers M3 may be formed to overlap each other or transmitted light of the laser light may be generated at the corresponding intersection(s). In addition, if the central modification layers M3 are formed to be close to each other, the cracks C3 developing from these central modification layers M3 may be connected to each other, resulting in formation of a protruding portion in the central portion of the processing target wafer W, which in turn arises a likelihood that the flatness of the separated surface of the processing target wafer W may be deteriorated.

Thus, it is desirable that the processing lines of the central modification layers M3 are formed independently so as not to cross each other or to be close to each other, as shown in FIG. 21, such that the cracks C3 developing from the adjacent central modification layers M3 along the plane direction are not connected. Desirably, a formation interval of the central modification layers M3 may be equal to or larger than, e.g., 10 μm.

The central modification layers M3 in the process A4 are formed as described above.

According to the second eccentricity correction method of the present exemplary embodiment, by forming, at the diametrically inside of the peripheral modification layer M1, the buffer layer B to be concentric with the peripheral modification layer M1 in the width larger than the eccentric amount between the chuck 100 and the processing target wafer W, it is possible to appropriately form the spiral-shaped internal modification layer M2. That is, even when the internal modification layer M2 is formed eccentrically with respect to the processing target wafer W, the corresponding eccentric amount can be absorbed by the buffer layer B, so that the formed internal modification layer M2 is not overlapped with the peripheral modification layer M1. Accordingly, the quality of the edge trimming processing can be maintained.

Further, according to the present exemplary embodiment, it is not necessary to perform the eccentricity correction in the central portion of the processing wafer W, that is, in the formation of the spiral-shaped internal modification layer M2. Thus, the control for the formation of the internal modification layer M2 can be simplified, and the internal modification layer M2 can easily formed. In addition, since there is no need to perform the eccentricity correction in the central portion of the processing target wafer W as described above, it is possible to appropriately reduce the aforementioned concerns for the occurrence of resonance and the reduction of the guide lifetime.

In addition, since the eccentricity correction need not be performed in the central portion of the processing target wafer W as described above, it is easy to maintain the rotation speed of the chuck 100 in forming the internal modification layer M2 in the central portion, and, as a result, it is easy to regulate the circumferential interval P constant. That is, the separation of the processing target wafer W can be performed uniformly within the surface thereof.

In addition, according to the above-described exemplary embodiment, the formation of the spiral-shaped internal modification layer M2 is started from the certain point within the processing width of the buffer layer B. Although the starting position of the formation of the spiral-shaped internal modification layer M2 can be selected as required, by forming it from the certain point within the processing width of the buffer layer B in this way, it becomes possible to reduce the influence upon the separation of the processing target wafer W while avoiding the internal modification layer M2 from being formed at the diametrically outside of the peripheral modification layer M1. To be specific, since a region where the internal modification layer M2 is not formed can be reduced, the processing target wafer W can be separated appropriately.

Further, in the present exemplary embodiment, since the internal modification layer M2 is formed in the spiral shape without being cut in the middle within the surface of the processing target wafer W, the tact for the formation of the internal modification layer M2 can be improved.

Further, according to the above-described exemplary embodiment, the internal modification layers M2 are formed such that the circumferential interval P and the diametrical interval Q are uniform within the surface of the processing target wafer W. However, the formation interval of the internal modification layers M2 may not be limited thereto.

Figure 23A:
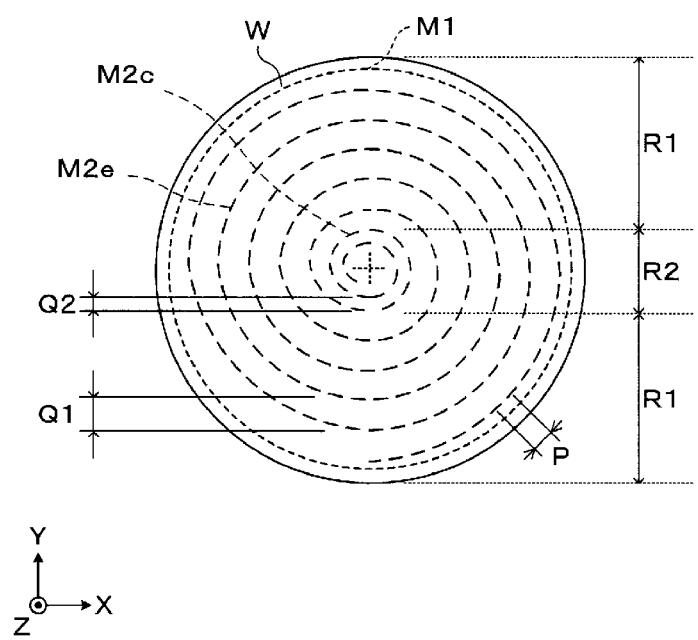
FIG. 23A and FIG. 23B are explanatory diagrams illustrating a method of forming an internal modification layer according to a second exemplary embodiment.
Figure 23B:
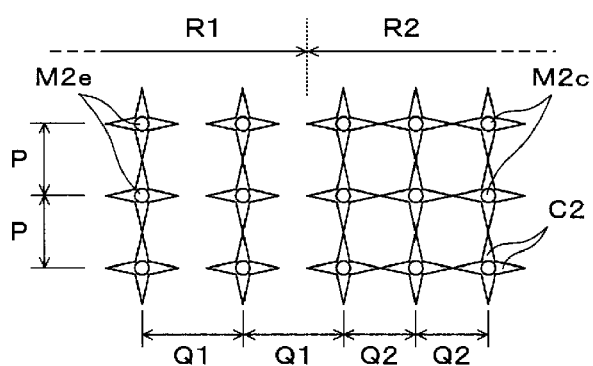

FIG. 23A and FIG. 23B are explanatory diagrams illustrating a method of forming the internal modification layer M2 according to a second exemplary embodiment. As shown in FIG. 23A and FIG. 23B, in the surface of the processing target wafer W in which the internal modification layer M2 according to the second exemplary embodiment is formed, there are formed areas where the diametrical intervals Q between the internal modification layers M2 are different. Specifically, a wide-interval region R1 in which the diametrical interval Q between the neighboring internal modification layers M2 is set to be wide is formed at a diametrically outer side of the processing target wafer W, and a narrow-interval region R2 in which the diametrical interval Q between the neighboring internal modification layers M2 is set to be narrow is formed at a diametrically inner side than the wide-interval region R1. Further, the circumferential interval P of the internal modification layer M2 is constant over the entire circumference both in the wide-interval region R1 and the narrow-interval region R2.

In addition, in the following description, the internal modification layer M2 formed in the wide-interval region R1 may sometimes be referred to as an outer modification layer M2$e$, and the internal modification layer M2 formed in the narrow-interval region R2 may sometimes be referred to as an inner modification layer M2$c$.

Here, in the wide-interval region R1, a formation interval Q1 of the neighboring outer modification layers M2$e$ is set such that the cracks C2 which develop in the plane direction during the formation of these neighboring outer modification layers M2$e$ are not connected to each other, as shown in FIG. 23B. The outer modification layers M2$e$ are started to be formed from a certain point within the processing width of the buffer layer B and are formed at the diametrically inside of the buffer layer B. Further, in the narrow-interval region R2, a formation interval Q2 of the neighboring inner modification layers M2$c$ is set so that the cracks C2 which develop in the plane direction during the formation of these neighboring inner modification layers M2$c$ are connected to each other, as shown in FIG. 23B. As an example, the formation interval Q1 of the outer modification layers M2$e$ may be 60 μm, and the formation interval Q2 of the inner modification layers M2$c$ may be 10 μm.

Figure 24A:
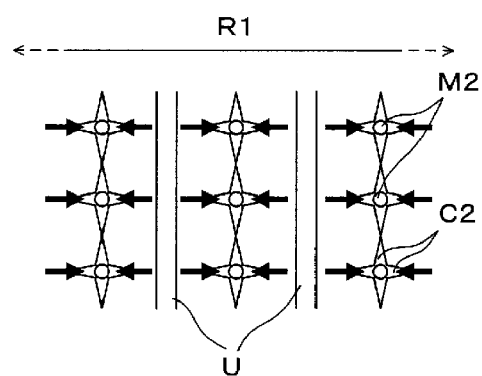
FIG. 24A and FIG. 24B are explanatory diagrams illustrating the internal modification layer formed in the second exemplary embodiment.
Figure 24B:
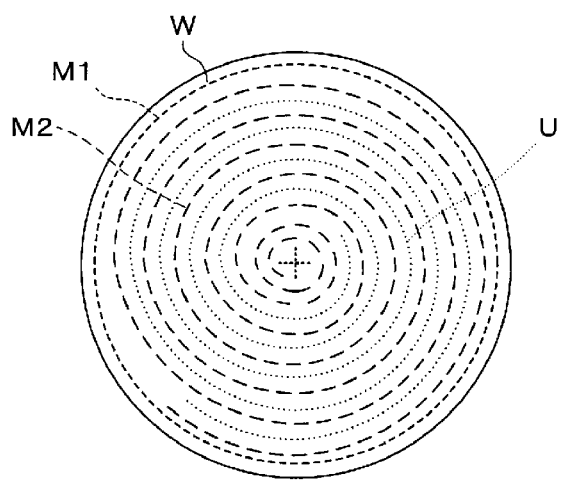

Further, the internal modification layer M2 is formed by radiating the laser light to the inside of the processing target wafer W to amorphize (polycrystallize) the portion to which the laser light is radiated. At this time, in the internal modification layer M2, a compressive stress is generated, as shown in FIG. 24A. Here, in the wide-interval region R1, since the cracks C1 of the adjacent outer modification layers M2$e$ are not connected, the generated compressive stress is accumulated in the outer modification layers M2$e$. Accordingly, a tensile stress resulting from the compressive stress are accumulated between the outer modification layers M2$e$ adjacent in the diametrical direction, as shown in FIG. 24A. Regions in which the tensile stress acts (hereinafter referred to as the "tensile regions U") are annularly formed over the entire circumference of the processing target wafer W, as shown in FIG. 24B.

Figure 25:
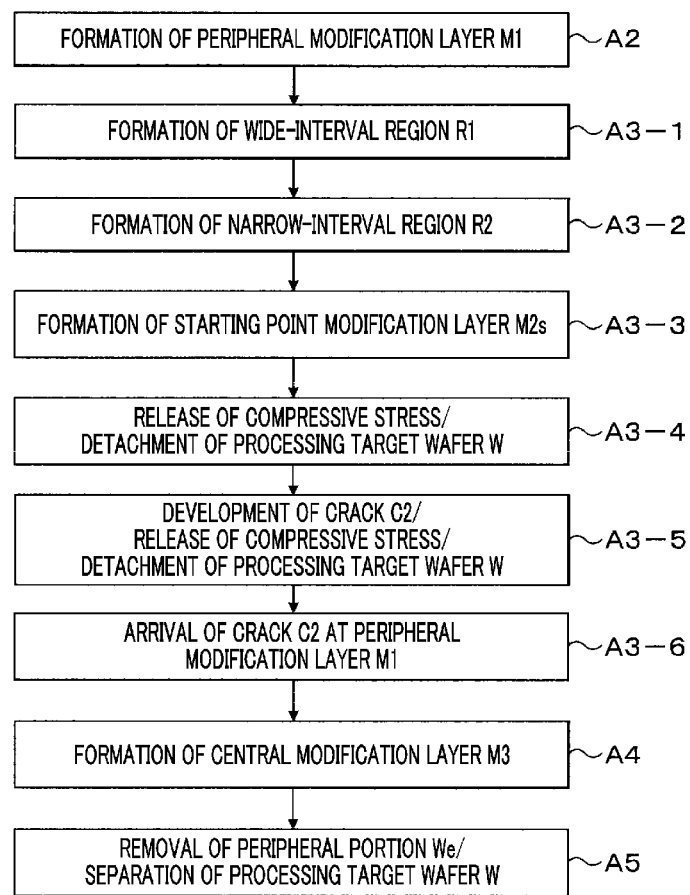
FIG. 25 is a flowchart illustrating example processes of a wafer processing according to the second exemplary embodiment.

Now, a method of forming the wide-interval region R1 and the narrow-interval region R2 as described above, and a method of separating the processing target wafer W will be described. FIG. 25 is a flowchart showing main processes of the method of forming the internal modification layers M2 in the process A3 and the method of separating the processing target wafer W. FIG. 26A to FIG. 26E are explanatory diagrams schematically showing the main processes of the method of forming the internal modification layers M2 in the process A3 and the method of separating the processing target wafer W. Each of FIG. 26A to FIG. 26E illustrates a cross section of the half of the processing target wafer W in the diametrical direction, seen from a thickness direction thereof. In addition, in FIG. 26A to FIG. 26E, illustration of the support wafer S is omitted for the simplicity of illustration.

In addition, the peripheral modification layer M1 and the cracks C1 are formed in the processing target wafer W prior to the formation of the internal modification layer M2 (process A2 in FIG. 6 and FIG. 25). Further, the internal modification layer M2 as the buffer layer B is formed. A method of forming the buffer layer B is the same as the above-described exemplary embodiment.

Figure 26A:
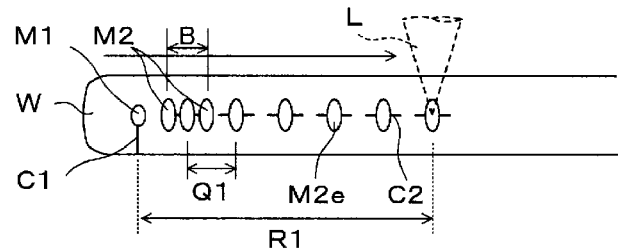
FIG. 26A to FIG. 26E are explanatory diagrams illustrating the example processes of the wafer processing according to the second exemplary embodiment.

As depicted in FIG. 26A, in the formation of the internal modification layer M2, the wide-interval region R1 is first formed (process A3-1 of FIG. 25). By rotating the chuck 100 (processing target wafer W) and moving the laser head 110 in the Y-axis direction from the diametrically outer side of the processing target wafer W toward the diametrically inner side thereof, the wide-interval region R1 is formed sequentially from the diametrically outer side of the processing target wafer W toward the diametrically inner side thereof. The formation interval Q1 of the outer modification layers M2e is, for example, 60 μm. Here, the cracks C2 that develop from the adjacent outer modification layers M2e in the wide-interval region R1 are not connected. Further, the formation of the outer modification layers M2e is begun from, for example, the certain point within the processing width of the buffer layer B.

Here, since the cracks C2 are not connected to each other, the compressive stresses are accumulated in the internal modification layers M2, and the tensile regions U are formed between the adjacent internal modification layers M2, as stated above.

Figure 26B:
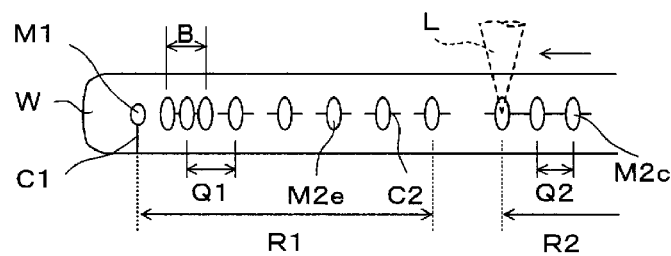

After the wide-interval region R1 is formed, the narrow-interval region R2 is formed, as illustrated in FIG. 26B (process A3-2 of FIG. 25). The narrow-interval region R2 is formed sequentially from the center of the processing target wafer W toward the diametrically outer side thereof by rotating the chuck 100 (processing target wafer W) and moving the laser head 110 in the Y-axis direction from the diametrically inner side of the processing target wafer W toward the diametrically outer side thereof. The formation interval Q2 of the inner modification layers M2c is, for example, 10 μm. Here, the cracks C2 that develop from the adjacent inner modification layers M2c in the narrow-interval region R2 are connected to each other sequentially.

Further, as illustrated in FIG. 26B, in the formation of the narrow-interval region R2 in the process A3-2, the crack C2 of the inner modification layer M2c located on the outermost side of the narrow-interval region R2 and the crack C2 of the outer modification layer M2e located on the innermost side of the wide-interval region R1 are not connected.

Further, the inner modification layer M2c is not formed in the central portion of the processing target wafer W where the circumferential internal P cannot be maintained.

Figure 26C:
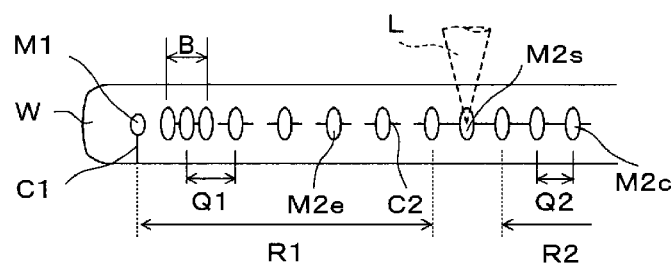

After the narrow-interval region R2 is formed, a starting point modification layer M2s serving as a starting point for the start of the separation of the processing target wafer W is formed, as depicted in FIG. 26C. Specifically, the internal modification layer M2 as the starting point modification layer M2s is formed between the wide-interval region R1 and the narrow-interval region R2. Accordingly, the crack C2 of the inner modification layer M2c located on the outermost side of the narrow-interval region R2 and the crack C2 of the one outer modification layer M2e positioned on the innermost side of the wide-interval region R1 are connected.

Figure 26D:
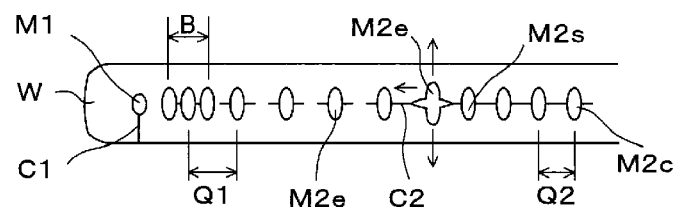

If the starting point modification layer M2s is formed, the cracks C2 of the wide-interval region R1 and the narrow-interval region R2 are connected, so that the compressive stress accumulated in the one outer modification layer M2e of the wide-interval region R1 is released. Then, by this release of the stress, the one outer modification layer M2e swells in a direction in which the first separation wafer W1 and the second separation wafer W2 are detached, as shown in FIG. 26D. That is, at the position where the corresponding one outer modification layer M2e is formed, the first separation wafer W1 and the second separation wafer W2 are detached with the crack C2 as the boundary (process A3-4 of FIG. 25).

In this way, if the first separation wafer W1 and the second separation wafer W2 are detached at the position where the corresponding one outer modification layer M2e is formed, the crack C2 develops outwards in the diametrical direction, as shown in FIG. 26D, while being affected by the force acting in the thickness direction (detachment direction) of the processing target wafer W due to the detachment. As a result, this crack C2 is connected to the crack C2 which is developing from another outer modification layer M2e adjacent thereto (process A3-5 of FIG. 25).

If the cracks C2 of the one outer modification layer M2e and the another outer modification layer M2e are connected, the compressive stress accumulated in the another outer modification layer M2e is released. Then, by this release of the stress, the first separation wafer W1 and the second separation wafer W2 are detached with the crack C2 as the boundary at the position where the another outer modification layer M2e is formed (process A3-5 of FIG. 25).

Then, if the first separation wafer W1 and the second separation wafer W2 are detached in this way at the position where the another outer modification layer M2e is formed, the crack C2 is made to further develop outwards in the diametrical direction while being affected by the force acting in the thickness direction (detachment direction) of the processing target wafer W due to the detachment.

Figure 26E:
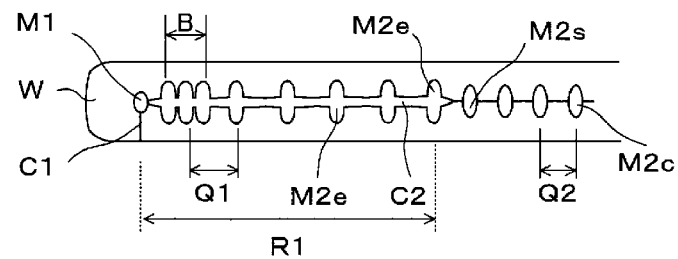

As the development of the crack C2, the release of the compressive stress, and the detachment of the second separation wafer W2 are repeated in a chain reaction in this way, the crack C2 reaches the peripheral modification layer M1, as illustrated in FIG. 26E (process A3-6 of FIG. 25).

If the internal modification layers M2 are formed in the entire surface of the processing target wafer W while the cracks C2 develop as stated above, the formation of the internal modification layers M2 in the process A3 is completed. Then, the central modification layer M3 is formed at the diametrically inside of the inner modification layers M2c (process A4 in FIG. 6 and FIG. 25), and the peripheral portion We and the second separation wafer W2 are removed thereafter (process A5 in FIG. 6 and FIG. 25).

According to the above-described second exemplary embodiment, the internal modification layers M2 are formed in the processing target wafer W, and these internal modification layer M2 are divided into the wide-interval region R1 and the narrow-interval region R2. In the wide-interval region R1, the detachment of the first separation wafer W1 and the second separation wafer W2 takes place in the chain reaction as stated above.

As stated above, according to the above-described exemplary embodiment, a gap is formed in the thickness direction within the processing target wafer W due to the detachment of the first separation wafer W1 and the second separation wafer W2. That is, since a region in which the first separation wafer W1 and the second separation wafer W2 are not connected is formed within the surface of the processing target wafer Was shown in FIG. 26E, the force required for the subsequent detachment of the second separation wafer W2 is reduced.

In addition, according to the above-described exemplary embodiment, by enlarging the diametrical interval Q of the internal modification layers M2 in the wide-interval region R1, the number of the internal modification layers M2 to be formed can be reduced. Thus, the time required for the formation of the internal modification layers M2 can be reduced, so that the throughput can be further improved.

Further, according to the above-described exemplary embodiment, the first separation wafer W1 and the second separation wafer W2 in the wide-interval region R1 are separated along the crack C2 that naturally develops by the release of the accumulated stress to be used as the starting point of the separation. For this reason, especially in the wide-interval region R1, a smooth separated surface having a periodic structure can be obtained.

Figure 27B:
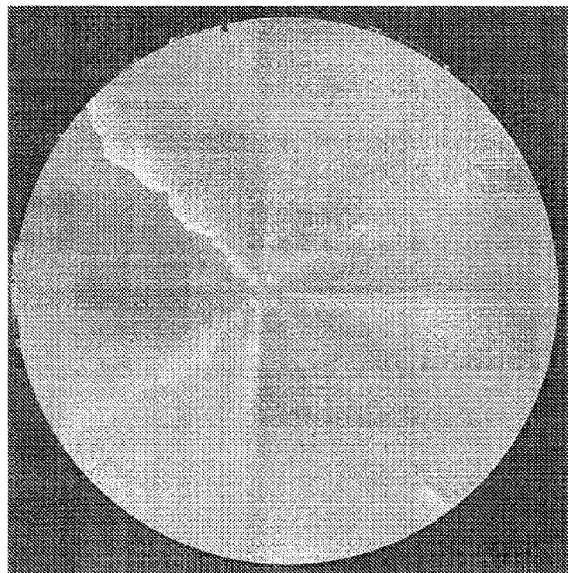
FIG. 27A and FIG. 27B are explanatory diagrams illustrating improvement of surface roughness of the processing target wafer.
Figure 27A:
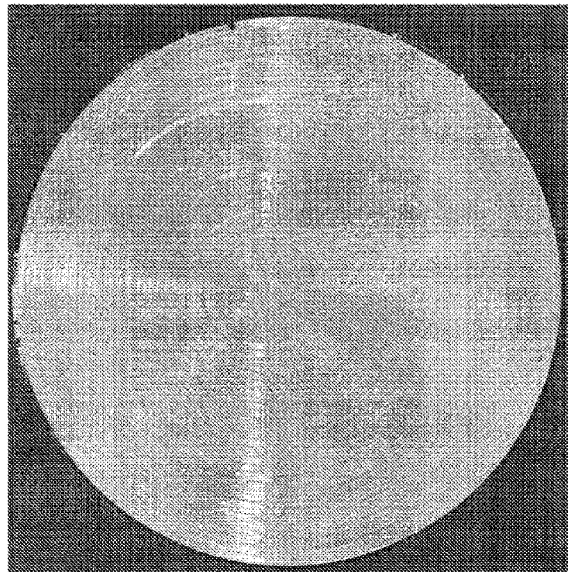

FIG. 27A provides a captured image of a separated surface of the processing target wafer W when the diametrical interval Q of the internal modification layers M2 is set to be uniform within the surface of the processing target wafer W, and FIG. 27B shows a captured image of a separated surface of the processing target wafer W when the internal modification layers M2 are formed to have the wide-interval region R1 and the narrow-interval region R2. As can be seen from FIG. 27A and FIG. 27B, by forming the wide-interval region R1 and the narrow-interval region R2 while allowing the cracks C2 to naturally develop by the release of the accumulated stress, the surface roughness after the separation is ameliorated, and the smooth separated surface can be obtained.

In addition, in the above-described second exemplary embodiment as well, the buffer layer B is formed, and the spiral-shaped internal modification layers M2 (the outer modification layers M2e and the inner modification layers M2c) are formed from the certain point within the processing width of the buffer layer B. Accordingly, even when the outer modification layers M2e are formed eccentrically with respect to the processing target wafer W, these outer modification layers M2e do not overlap the peripheral modification layer M1. Therefore, the quality of the edge trimming processing can be maintained.

Figure 28A:
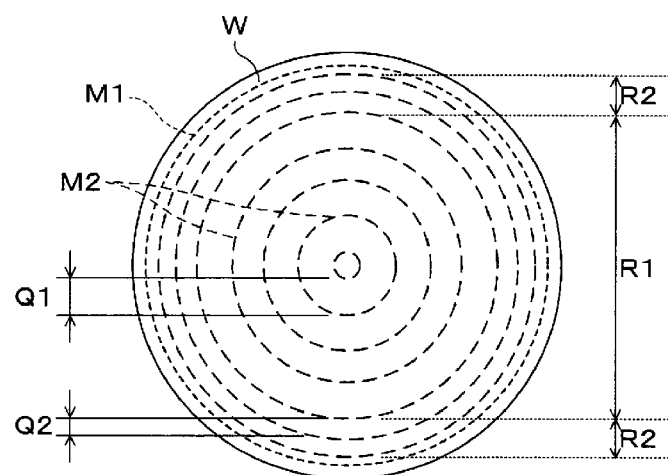
FIG. 28A and FIG. 28B are explanatory diagrams illustrating other examples of the internal modification layer formed according to the second exemplary embodiment.
Figure 28B:
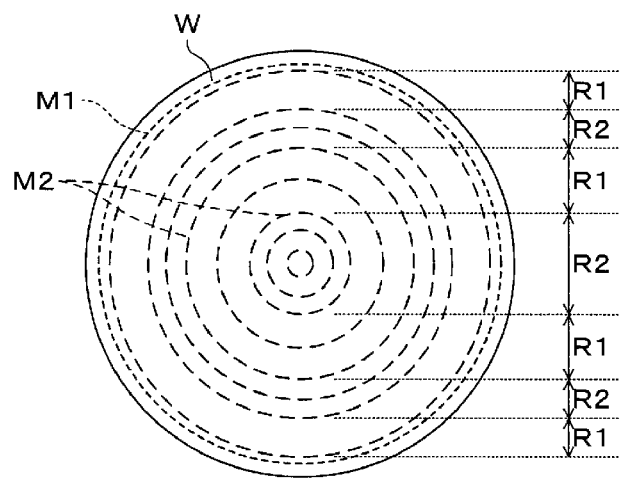

Moreover, according to the above-described second exemplary embodiment, the wide-interval region R1 is formed at the diametrically outer side, and the narrow-interval region R2 is formed at the diametrically inner side. As shown in FIG. 28A, however, the narrow-interval region R2 may be formed at the diametrically outer side of the processing target wafer W, and the wide-interval region R1 may be formed inside this narrow-interval region R2, when viewed from the top. As another example, as shown in FIG. 28B, the wide-interval region R1 and the narrow-interval region R2 may be alternately formed at the diametrically outer side of the processing target wafer W.

Further, in the above-described second exemplary embodiment, the wide-interval region R1 and the narrow-interval region R2 are formed with respect to the diametrical direction of the processing target wafer W, that is, the diametrical interval Q of the internal modification layers M2 is changed. Instead, however, the circumferential interval P (pulse pitch) may be changed. Moreover, both the diametrical interval Q and the circumferential interval P may be changed. In such a case, since the number of the internal modification layers M2 to be formed within the surface of the processing target wafer W is further reduced, the throughput can be further improved.

Figure 29A:
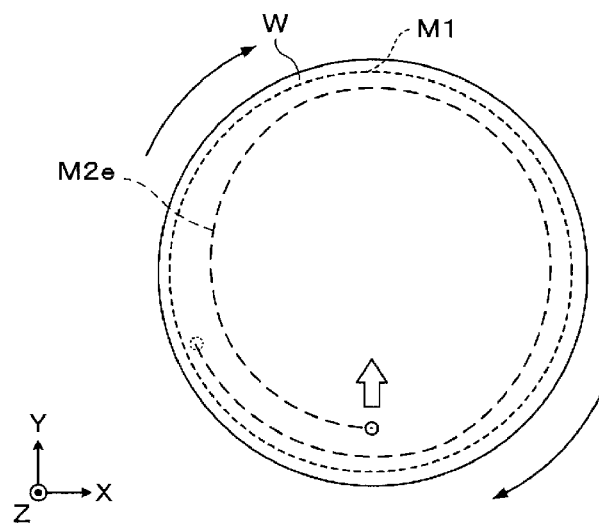
FIG. 29A and FIG. 29B are explanatory diagrams illustrating other examples of the internal modification layer formed according to the second exemplary embodiment.
Figure 29B:
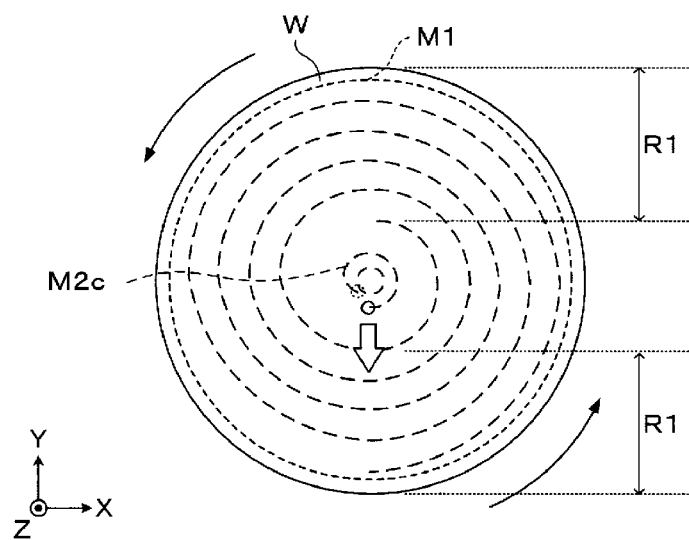

Further, in the above-described second exemplary embodiment, the separation of the processing target wafer W is started by forming the starting point modification layer M2s between the wide-interval region R1 and the narrow-interval region R2. However, the way how to start the separation of the processing target wafer W is not limited thereto. By way of example, after forming the wide-interval region R1 up to a predetermined position from the diametrically outer side of the processing target wafer W toward the diametrically inner side thereof as shown in FIG. 29A, the separation may be begun by forming the narrow-interval region R2 from the center of the processing target wafer W toward the diametrically outer side thereof to be joined with the internal modification layer M2 of the wide-interval region R1, as illustrated in FIG. 29B.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to perform a periphery removing processing and a separation processing for a processing target object appropriately.

We claim:

1. A processing apparatus configured to process a processing target object, comprising:
   a holder configured to hold the processing target object;
   a modifying device configured to radiate laser light to an inside of the processing target object to form multiple modification layers along a plane direction of the processing target object; and
   a controller and a storage including a computer program, wherein the storage and the computer program are configured, with the controller, to control a rotation of the holder, a movement of the holder in a diametrical direction, and an operation of the modifying device,
   wherein the controller controls the holder and the modifying device to form:
   a peripheral modification layer which serves as a starting point where a peripheral portion of the processing target object as a removing target is detached;
   a first internal modification layer in a ring shape along the plane direction to be concentric with the peripheral modification layer at a diametrically inner side of the peripheral modification layer by radiating the laser light to the inside of the processing target object from the modifying device periodically while rotating the holder, moving the holder in the diametrical direction, and repeating the radiating of the laser light while rotating the holder and the moving of the holder in the diametrical direction; and
   a second internal modification layer in a spiral shape at a diametrically inner side of the first internal modification layer by radiating the laser light to the inside of the processing target object from the modifying device periodically while rotating the holder and moving the holder in the diametrical direction,
   wherein the controller controls the modifying device such that a formation of the second internal modification layer begins from a point within a processing width of the first internal modification layer in a diametrical direction.

2. The processing apparatus of claim 1,
   wherein the controller controls the modifying device such that a processing width of the first internal modification layer in a diametrical direction is larger than an eccentric amount between a center of the processing target object and a center of the holder.

3. A processing method of processing a processing target object, comprising:

forming, by a modifying device, multiple modification layers along a plane direction of the processing target object by radiating laser light to an inside of the processing target object held by a holder, wherein the forming of the multiple modification layers comprises:

forming a peripheral modification layer which serves as a starting point where a peripheral portion of the processing target object as a removing target is detached;

forming a first internal modification layer in a ring shape along the plane direction to be concentric with the peripheral modification layer at a diametrically inner side of the peripheral modification layer by radiating the laser light to the inside of the processing target object from the modifying device periodically while rotating the holder, moving the holder in the diametrical direction, and repeating the radiating of the laser light while rotating the holder and the moving of the holder in the diametrical direction; and forming a second internal modification layer in a spiral shape at a diametrically inner side of the first internal modification layer by radiating the laser light to the inside of the processing target object from the modifying device periodically while rotating the holder and moving the holder in the diametrical direction, wherein the forming of the second internal modification layer begins from a point within the processing width of the first internal modification layer in the diametrical direction.

4. The processing method of claim 3, wherein the first internal modification layer is formed in a processing width larger than an eccentric amount between a center of the holder and a center of the processing target object in a diametrical direction.

* * * * *